United States Patent
Wang

(10) Patent No.: US 11,569,803 B2
(45) Date of Patent: Jan. 31, 2023

(54) STAGGER SIGNAL GENERATION CIRCUIT

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/666,750

(22) Filed: Feb. 8, 2022

(65) Prior Publication Data

US 2022/0294434 A1    Sep. 15, 2022

Related U.S. Application Data

(63) Continuation of application No. PCT/CN2021/112026, filed on Aug. 11, 2021.

(30) Foreign Application Priority Data

Mar. 9, 2021    (CN) .......................... 202110256944.5

(51) Int. Cl.
   *H03K 5/01*    (2006.01)
   *H03K 3/037*    (2006.01)
   *H03K 5/00*    (2006.01)

(52) U.S. Cl.
   CPC .............. *H03K 5/01* (2013.01); *H03K 3/037* (2013.01); *H03K 2005/00013* (2013.01)

(58) Field of Classification Search
   CPC ..................... H03K 5/01; H03K 3/037; H03K 2005/00013; H03K 3/64

USPC ........................................ 327/261
See application file for complete search history.

(56) References Cited

U.S. PATENT DOCUMENTS 7,221,601 B2 *  5/2007  Jacunski ............. G11C 11/4076
                                                    365/194
7,868,671 B2 *  1/2011  Park ....................... H03L 7/0814
                                                    327/158
8,570,086 B2 * 10/2013  Hirairi .................. H03K 3/0375
                                                    327/212
(Continued)

FOREIGN PATENT DOCUMENTS

CN          1716776 A      1/2006
CN        101102109 A      1/2008
(Continued)

*Primary Examiner* — Ryan Jager
(74) *Attorney, Agent, or Firm* — Cooper Legal Group, LLC

(57) ABSTRACT

A stagger signal generation circuit is provided. The stagger signal generation circuit includes: a stagger pulse generation circuit, configured to generate a first pulse signal according to a first control signal and generate a second pulse signal according to a second control signal, the first control signal and the second control signal being inverted signals, and the first pulse signal and the second pulse signal being stagger pulse signals; and a delay signal output circuit including G signal output circuits, G being an integer greater than or equal to 2. Each non-first-stage signal output circuits receives a delay output signal outputted by a respective previous-stage signal output circuit as an input signal of a current-stage signal output circuit, and a first-stage signal output circuit receives an initial input signal as an input signal of the first-stage signal output circuit.

19 Claims, 24 Drawing Sheets

(56) References Cited

U.S. PATENT DOCUMENTS

| | | | |
|---|---|---|---|
| 8,797,077 B2* | 8/2014 | Sasagawa | H03K 3/0372 327/212 |
| 10,763,831 B2* | 9/2020 | Akondy | H03K 3/017 |
| 10,763,833 B2* | 9/2020 | Muellner | H03K 3/014 |
| 2005/0149779 A1* | 7/2005 | Bleakley | H03K 5/12 714/700 |
| 2005/0242861 A1* | 11/2005 | Kanda | H03K 3/356113 327/218 |
| 2006/0001599 A1 | 1/2006 | Onozawa et al. | |
| 2006/0152994 A1 | 7/2006 | Jacunski | |
| 2008/0012615 A1 | 1/2008 | Park | |
| 2014/0077855 A1 | 3/2014 | Sasagawa | |
| 2020/0177169 A1 | 6/2020 | Akondy et al. | |
| 2020/0212895 A1 | 7/2020 | Muellner et al. | |

FOREIGN PATENT DOCUMENTS

| | | |
|---|---|---|
| CN | 102148614 A | 8/2011 |
| CN | 102215037 A | 10/2011 |
| CN | 202357595 U | 8/2012 |
| CN | 102769458 A | 11/2012 |
| CN | 103840796 A | 6/2014 |
| CN | 103944568 A | 7/2014 |
| CN | 106506001 A | 3/2017 |
| CN | 207475510 U | 6/2018 |
| CN | 207801891 U | 8/2018 |
| CN | 109388882 A | 2/2019 |
| CN | 208797912 U | 4/2019 |
| CN | 110428048 A | 11/2019 |
| CN | 110995207 A | 4/2020 |
| CN | 111277252 A | 6/2020 |
| JP | 2014060669 A | 4/2014 |
| KR | 20110076672 A | 7/2011 |

* cited by examiner

STAGGER SIGNAL GENERATION CIRCUIT

CROSS-REFERENCE TO RELATED APPLICATIONS

This application is a continuation of International Application No. PCT/CN2021/112026, filed on Aug. 11, 2021, which is based upon and claims priority to Chinese patent application No. 202110256944.5, filed on Mar. 9, 2021 in China Patent Office and entitled "STAGGER SIGNAL GENERATION CIRCUIT". The contents of International Application No. PCT/CN2021/112026 and Chinese patent application No. 202110256944.5 are hereby incorporated by reference in their entireties.

BACKGROUND

In design of semiconductor circuits, equidistant stagger signals are often used, and the equidistant stagger signals refer to signals generated at an interval of a fixed delay.

For a synchronous signal, an equidistant stagger signal is generally generated by virtue of a clock signal. For an asynchronous signal, a required equidistant stagger signal is generated by inserting a delay cell, and a delay between signals can be implemented by inserting a corresponding delay cell according to demands.

However, studies have found that in the manner of generating an equidistant stagger signal by using a synchronous signal, the delay between equidistant stagger signals is necessarily an integer multiple of a clock period, and the controllability of the delay between equidistant stagger signals is poor. In the manner of generating an equidistant stagger signal by using an asynchronous signal, although the controllability of the delay between signals is good, the area of the formed circuit layout and the power consumption of a circuit may be significantly increased.

SUMMARY

Embodiments of this disclosure relate to, but are not limited to, a stagger signal generation circuit.

Embodiments of this disclosure provide a stagger signal generation circuit. The stagger signal generation circuit includes: a stagger pulse generation circuit configured to generate a first pulse signal according to a first control signal and generate a second pulse signal according to a second control signal, the first control signal and the second control signal are inverted signals, and the first pulse signal and the second pulse signal are stagger pulse signals; and a delay signal output circuit including G signal output circuits, G is an integer greater than or equal to 2, the signal output circuit is configured to receive an input signal, the first pulse signal and the second pulse signal and output a delay output signal. Herein each non-first-stage signal output circuits receives the delay output signal outputted by a respective previous-stage signal output circuit as an input signal of a current-stage signal output circuit, and a first-stage signal output circuit receives an initial input signal as an input signal of the first-stage signal output circuit; a rising edge of the delay output signal generated by each signal output circuit has a first delay from a rising edge of the received delay output signal outputted by the respective previous-stage signal output circuit or the initial input signal; and a falling edge of the delay output signal generated by each signal output circuit has a second delay from a falling edge of the received delay output signal outputted by the respective previous-stage signal output circuit or the initial input signal.

DETAILED DESCRIPTION

Figure 1:
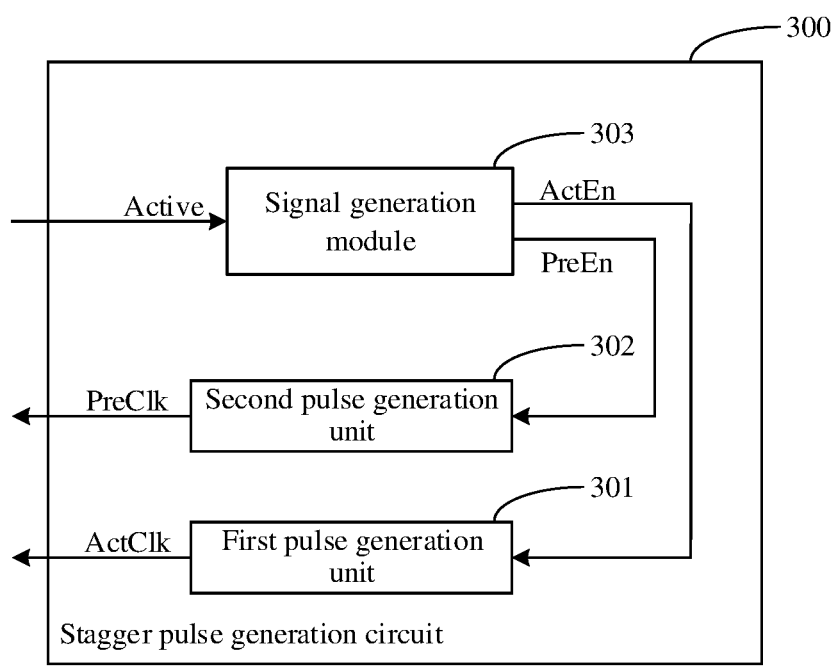
FIG. 1 and FIG. 2 are schematic structural diagrams of a stagger pulse generation circuit provided by an embodiment of this disclosure.

In the manner of generating an equidistant stagger signal using a synchronous signal, the delay between equidistant stagger signals is necessarily an integer multiple of a clock period, and the controllability of the delay between the equidistant stagger signals is poor. In the manner of generating an equidistant stagger signal using an asynchronous signal, although the controllability of the delay between signals is good, the area of the formed circuit layout and the power consumption of a circuit may be significantly increased.

To at least partially alleviate the problems above, embodiments of this disclosure provide a stagger signal generation circuit. The circuit includes a stagger pulse generation circuit and a delay signal output circuit. The stagger pulse generation circuit is configured to generate a first pulse signal according to a first control signal and generate a second pulse signal according to a second control signal. The first control signal and the second control signal are inverted signals. The first pulse signal and the second pulse signal are stagger pulse signals. The delay signal output circuit includes G signal output circuits, and G is an integer greater than or equal to 2. Each signal output circuit is configured to receive an input signal, the first pulse signal and the second pulse signal and output a delay output signal. Each non-first-stage signal output circuit receives the delay output signal outputted by a respective previous-stage signal output circuit as an input signal of a current-stage signal output circuit. A first-stage signal output circuit receives an initial input signal as an input signal of the first-stage signal output circuit. A rising edge of the delay output signal generated by each signal output circuit has a first delay from a rising edge of the received delay output signal outputted by the respective previous-stage signal output circuit or the initial input signal. A falling edge of the delay output signal generated by each signal output circuit has a second delay from a falling edge of the received delay output signal outputted by the respective previous-stage signal output circuit or the initial input signal.

To make the objectives, technical solutions, and advantages of embodiments of this disclosure clearer, the embodiments of this disclosure are described below in detail with reference to the accompanying drawings. However, those ordinary skilled in the art can understand that, in each embodiment of this disclosure, many technical details are proposed for a reader to better understand this disclosure. However, the technical solutions claimed by this disclosure can be implemented, even without these technical details and various changes and modifications based on the following embodiments. The following divisions of various embodiments are for convenience of description, and should not constitute any limitation on the specific implementation of this disclosure, and the various embodiments may be combined with each other without contradiction.

Figure 2:
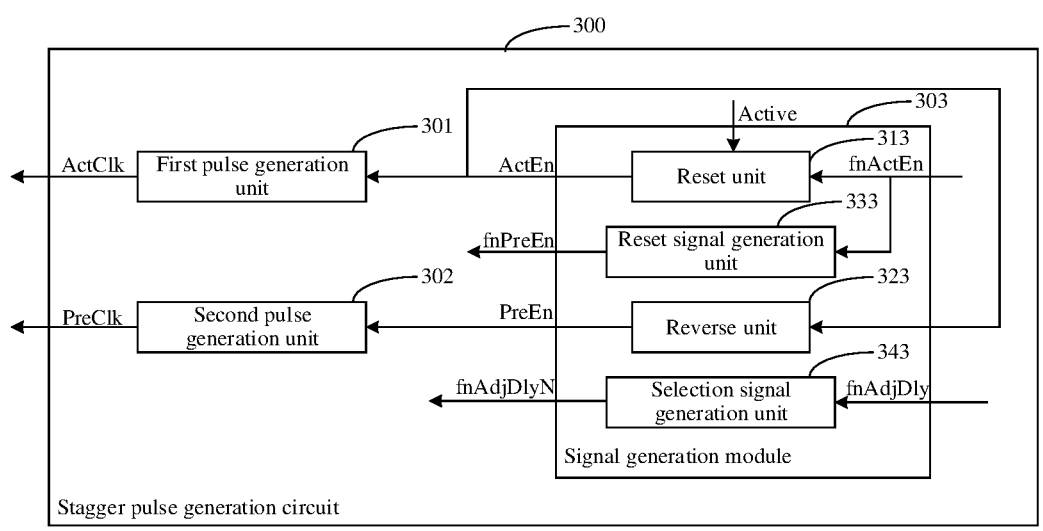
Figure 3:
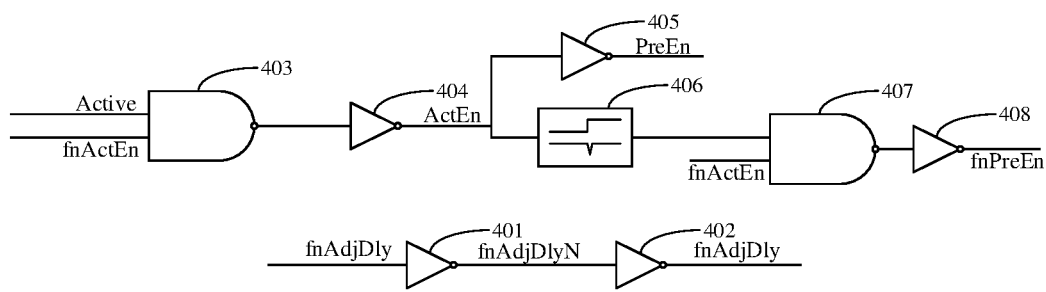
FIG. 3 is a specific schematic circuit diagram of a signal generation module provided by an embodiment of this disclosure.
Figure 4:
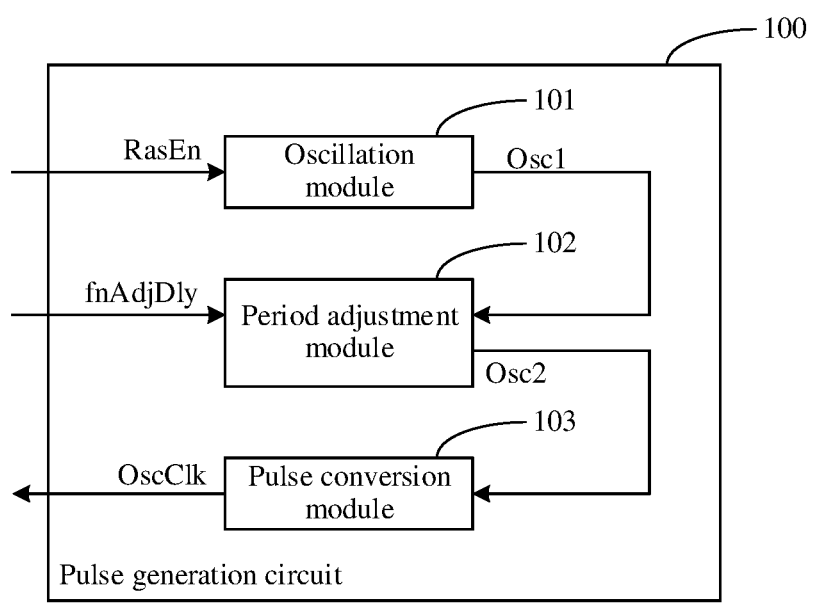
FIG. 4 and FIG. 5 are schematic structural diagrams of a pulse generation circuit provided by an embodiment of this disclosure.
Figure 5:
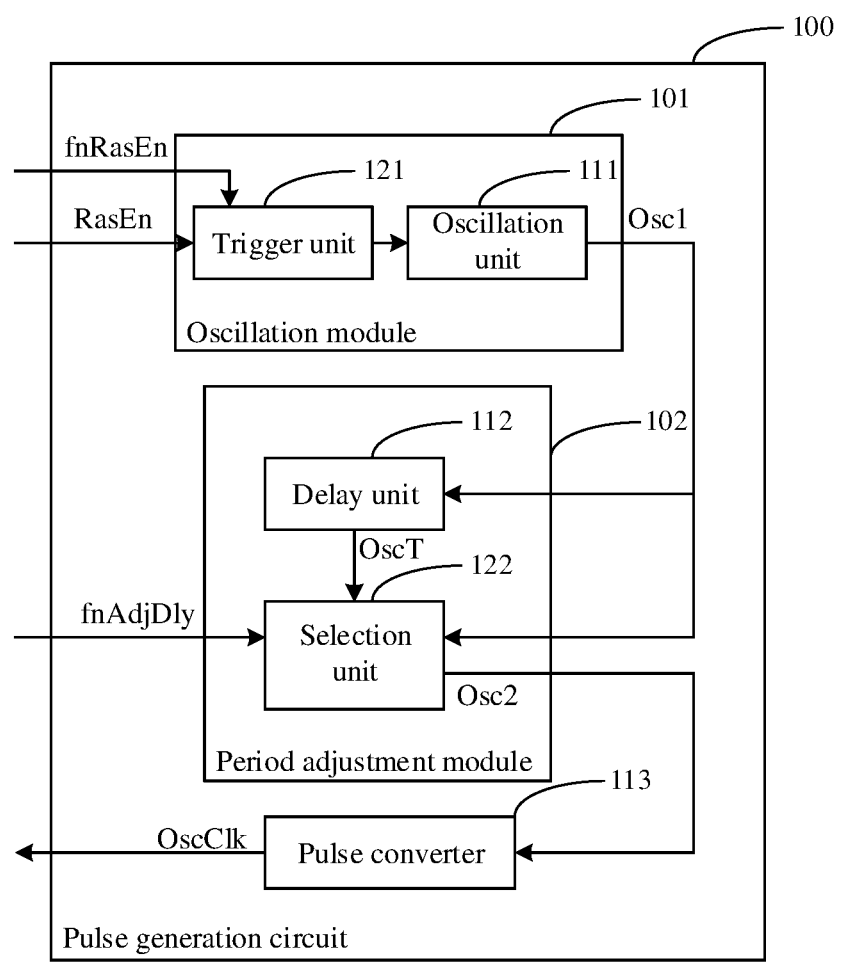
Figure 6:
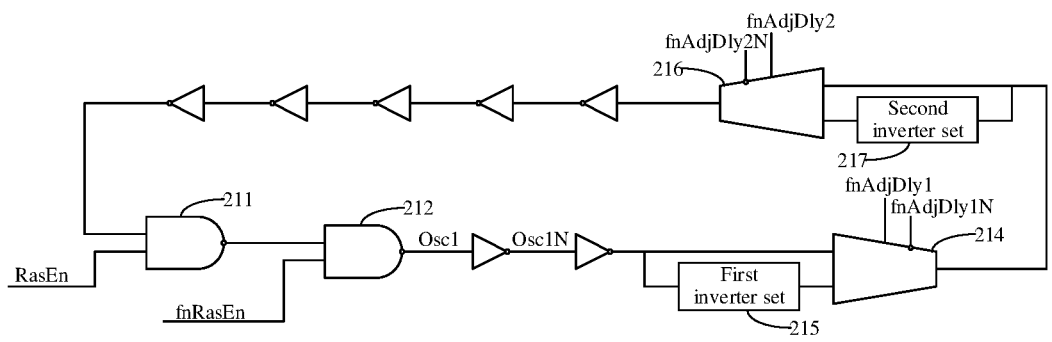
FIG. 6 is a specific schematic circuit diagram of an oscillation module provided by an embodiment of this disclosure.
Figure 7:
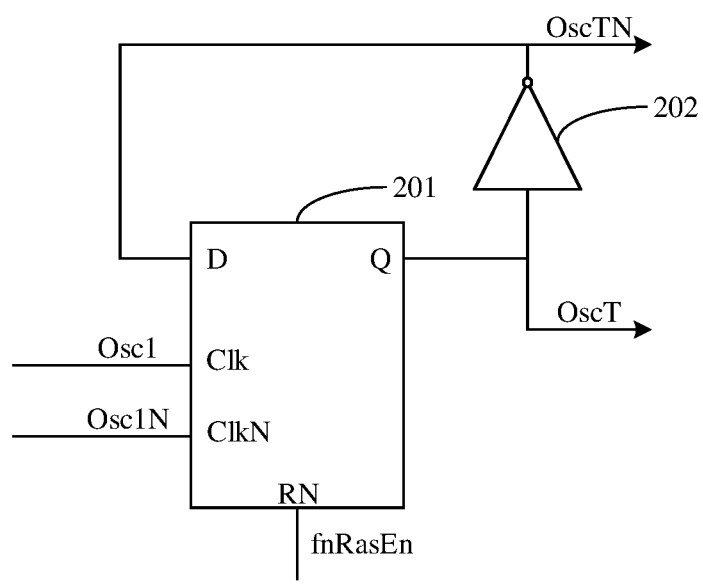
FIG. 7 is a schematic structural diagram of a delay unit provided by an embodiment of this disclosure.
Figure 8:
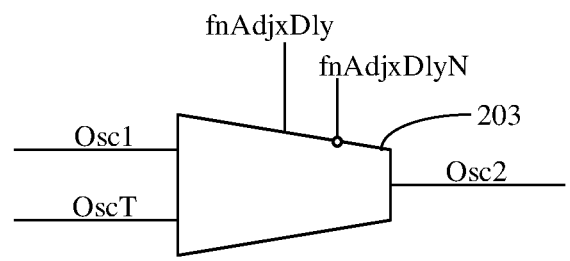
FIG. 8 is a schematic structural diagram of a selection unit provided by an embodiment of this disclosure.
Figure 9:
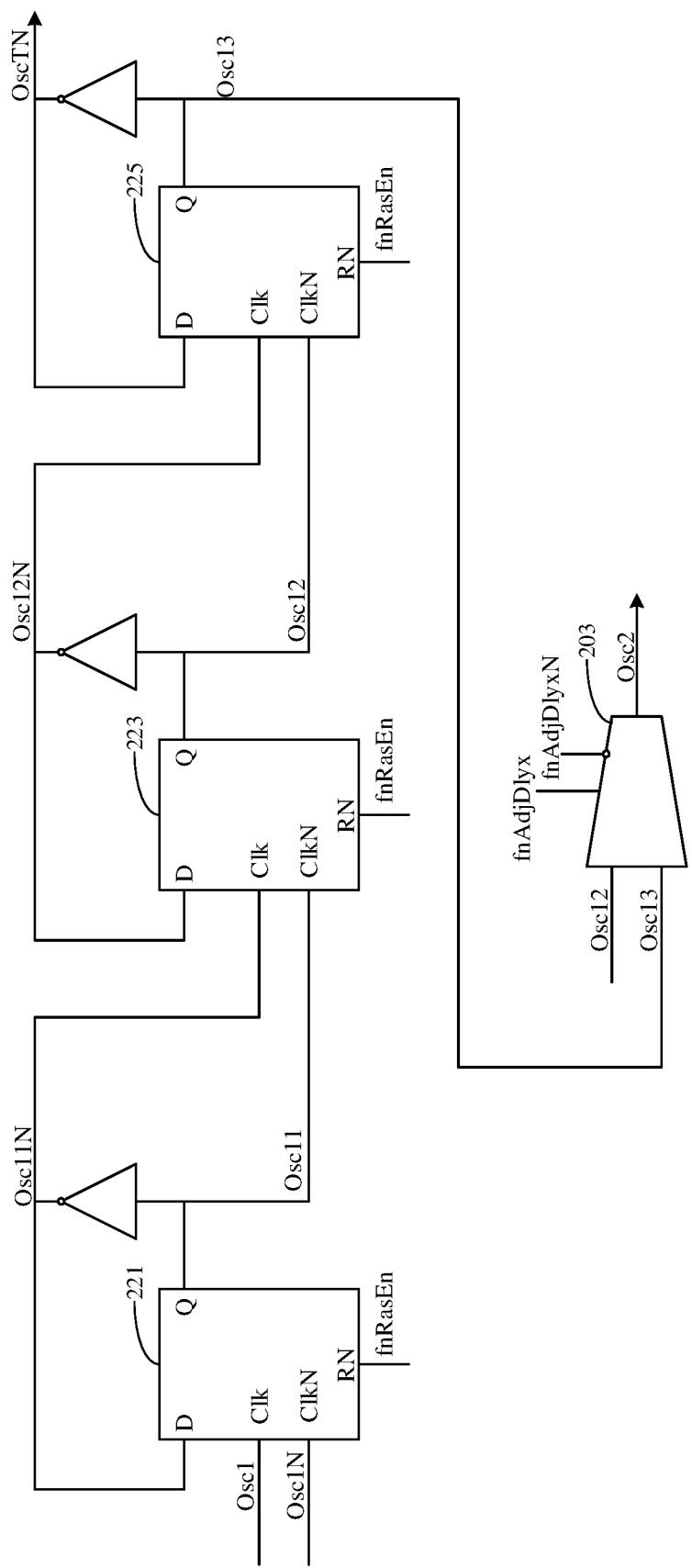
FIG. 9 and FIG. 10 are schematic circuit diagrams of a period adjustment module provided by an embodiment of this disclosure.
Figure 10:
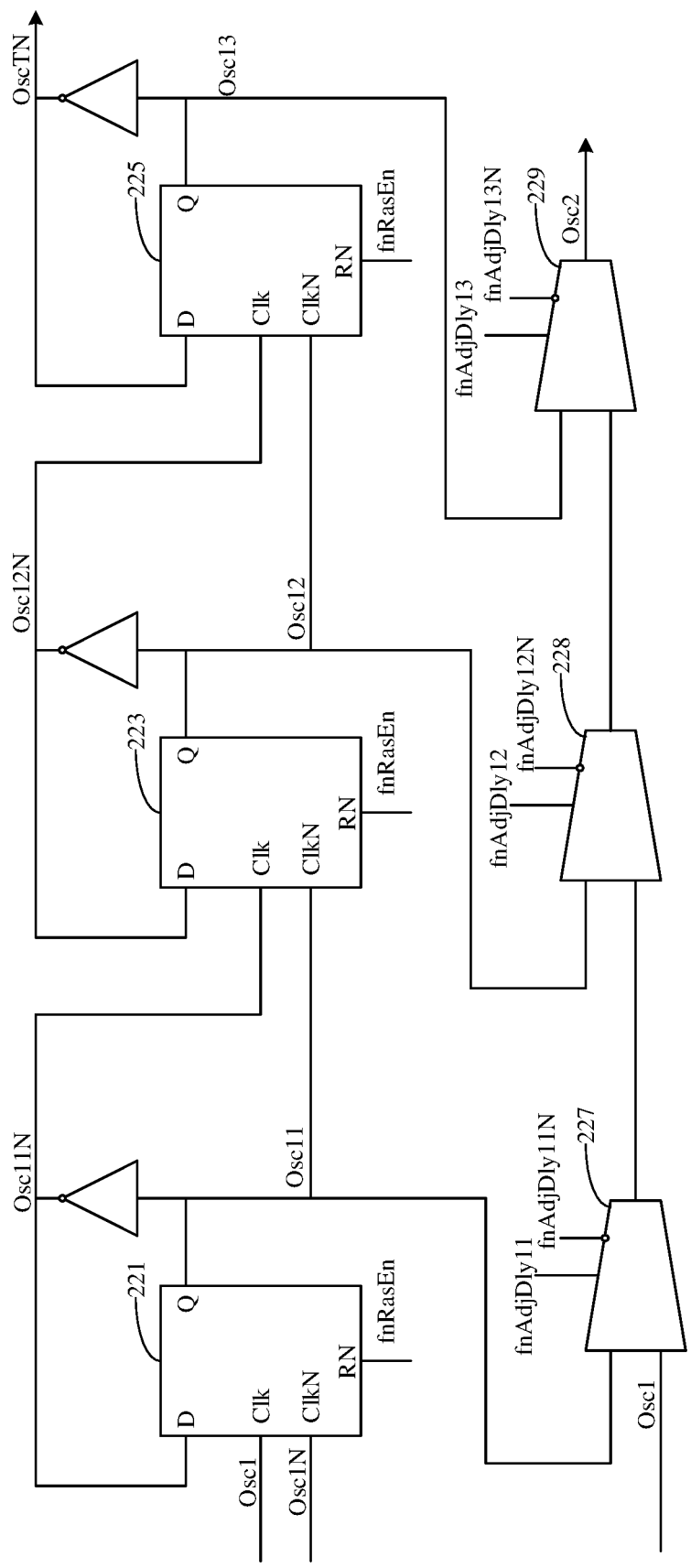
Figure 11:
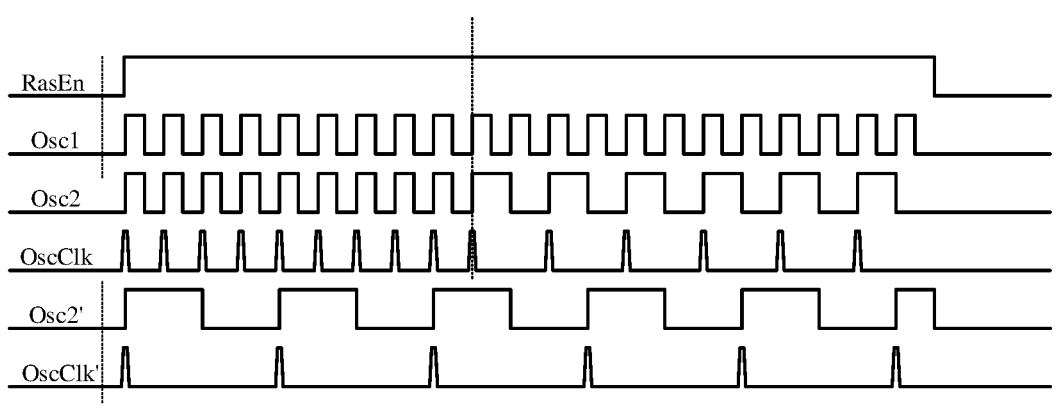
FIG. 11 is a schematic diagram of a time sequence of signals in a pulse generation circuit provided by an embodiment of this disclosure.
Figure 12:
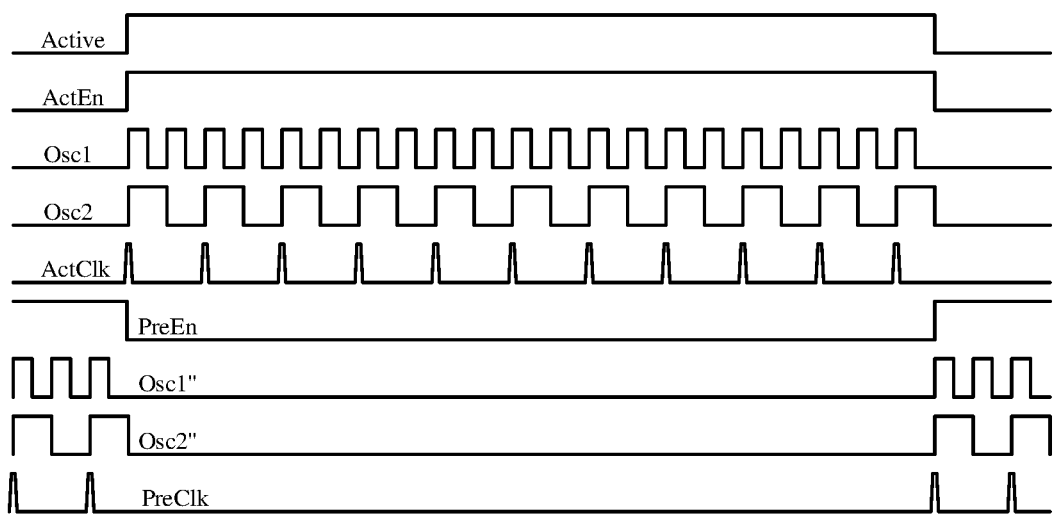
FIG. 12 is a schematic diagram of a time sequence of signals in a stagger pulse generation circuit provided by an embodiment of this disclosure.
Figure 13:
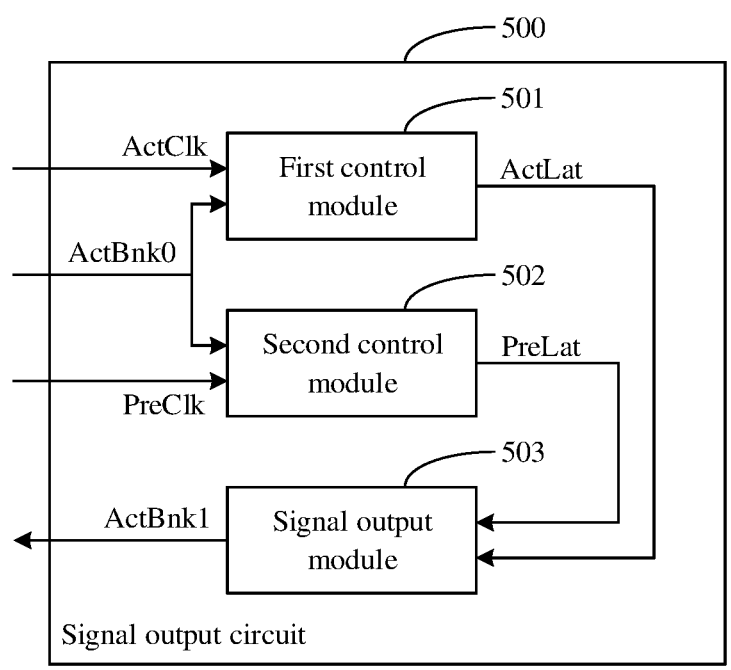
FIG. 13 is a schematic structural diagram of a signal output circuit provided by an embodiment of this disclosure.
Figure 14:
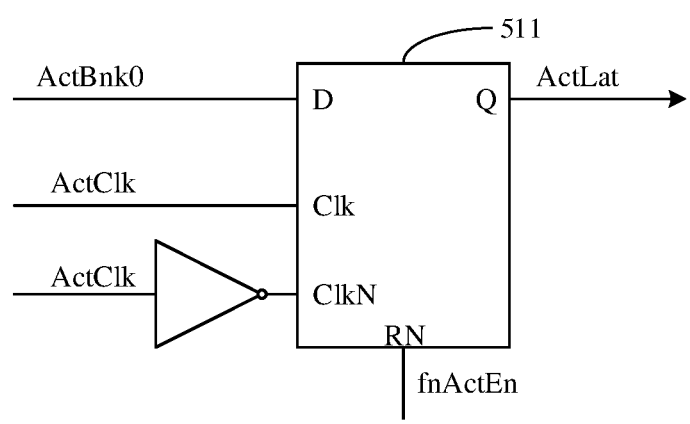
FIG. 14 is a specific schematic circuit diagram of a first control module provided by an embodiment of this disclosure.
Figure 15:
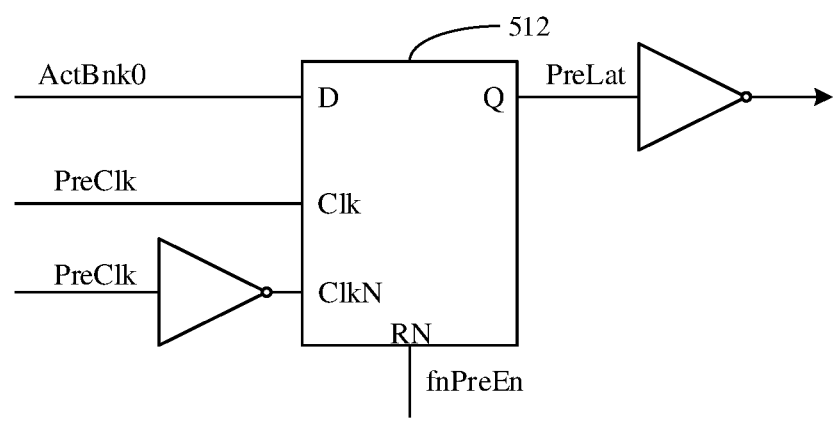
FIG. 15 is a specific schematic circuit diagram of a second control module provided by an embodiment of this disclosure.
Figure 16:
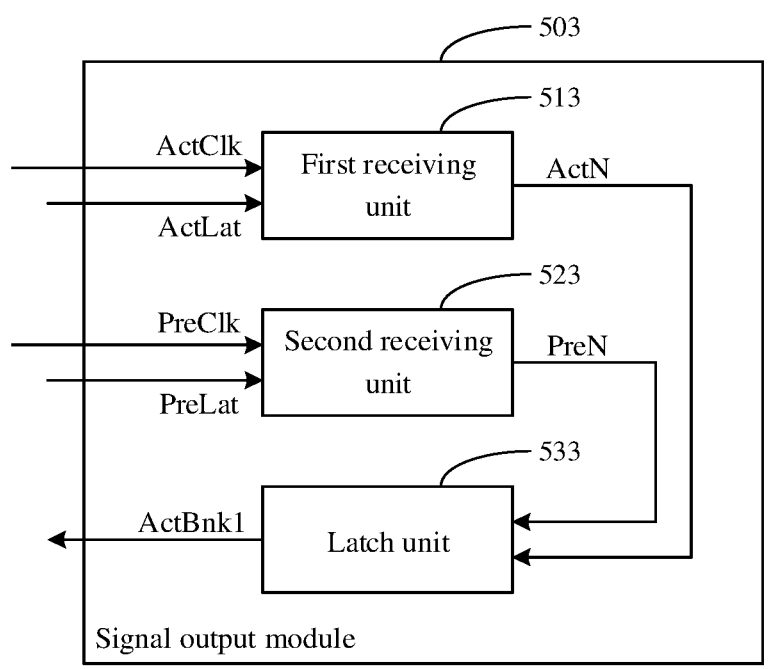
FIG. 16 is a schematic structural diagram of a signal output module provided by an embodiment of this disclosure.
Figure 17:
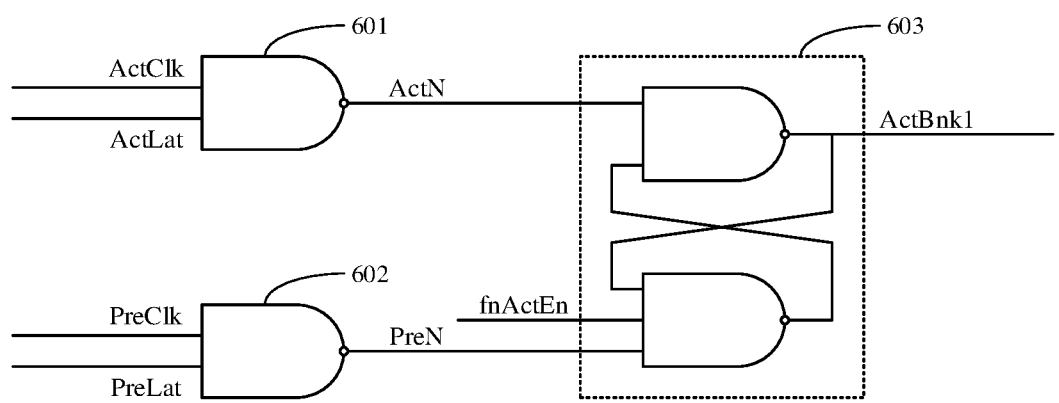
FIG. 17 and FIG. 18 are specific schematic circuit diagrams of a signal output module provided by an embodiment of this disclosure.
Figure 18:
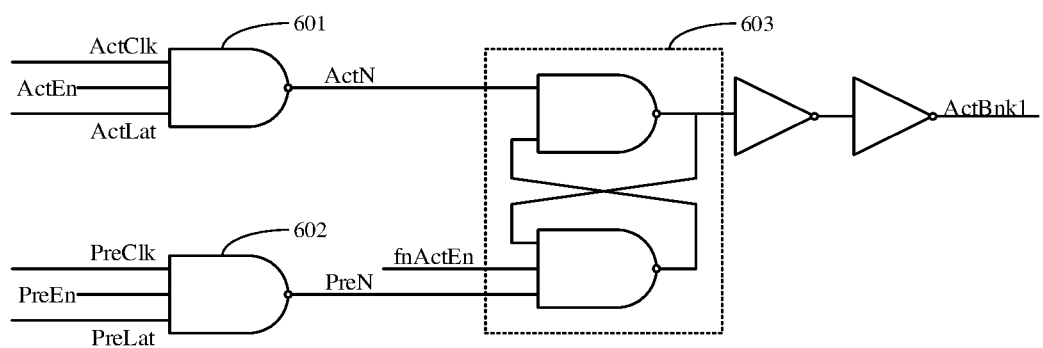
Figure 19:
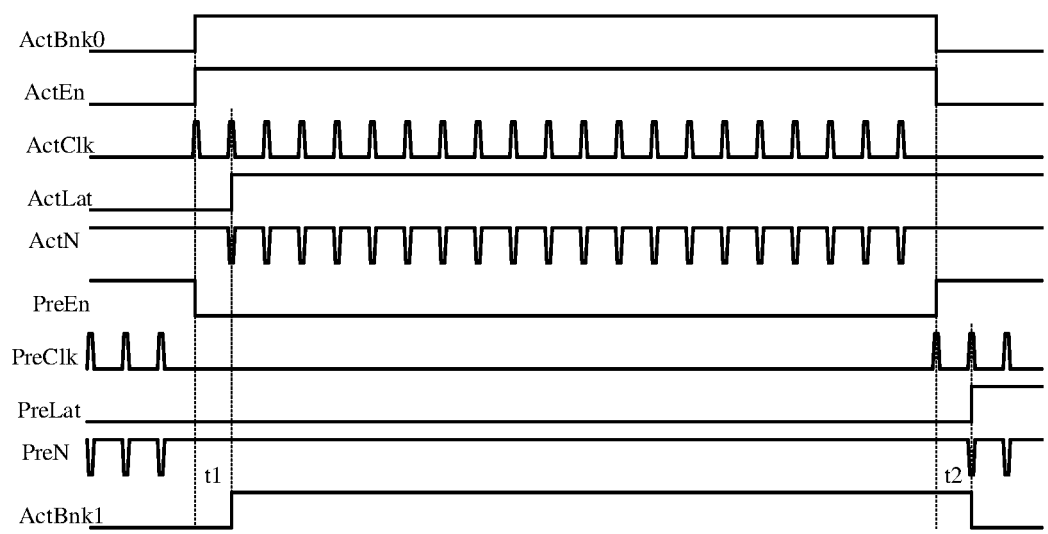
FIG. 19 is a schematic diagram of a time sequence of signals in a signal output circuit provided by an embodiment of this disclosure.
Figure 20:
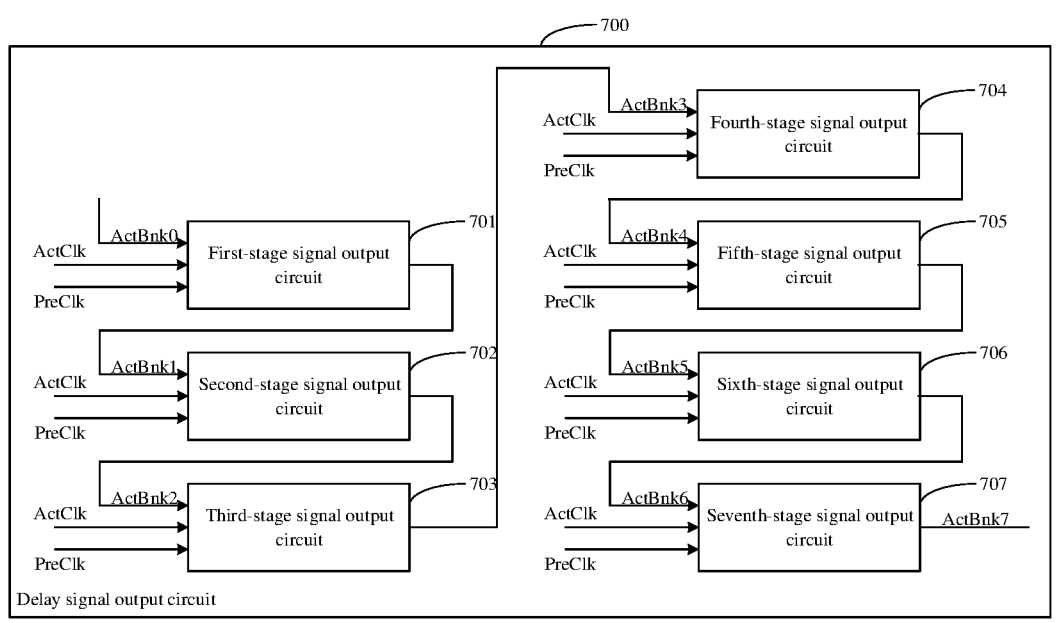
FIG. 20 and FIG. 21 are schematic structural diagrams of a delay signal output circuit provided by an embodiment of this disclosure.
Figure 21:
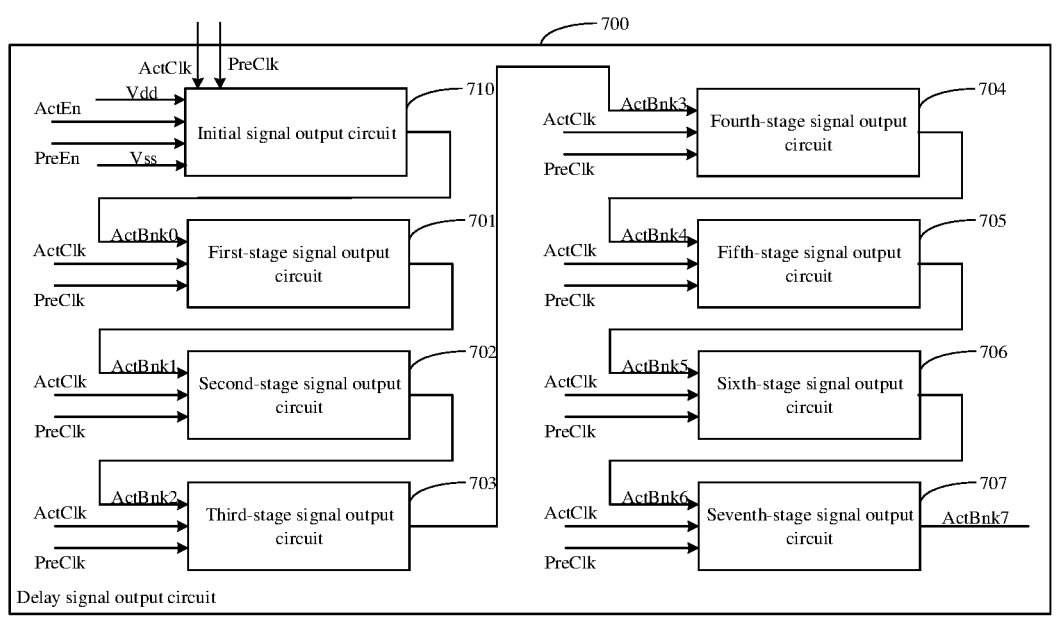
Figure 22:
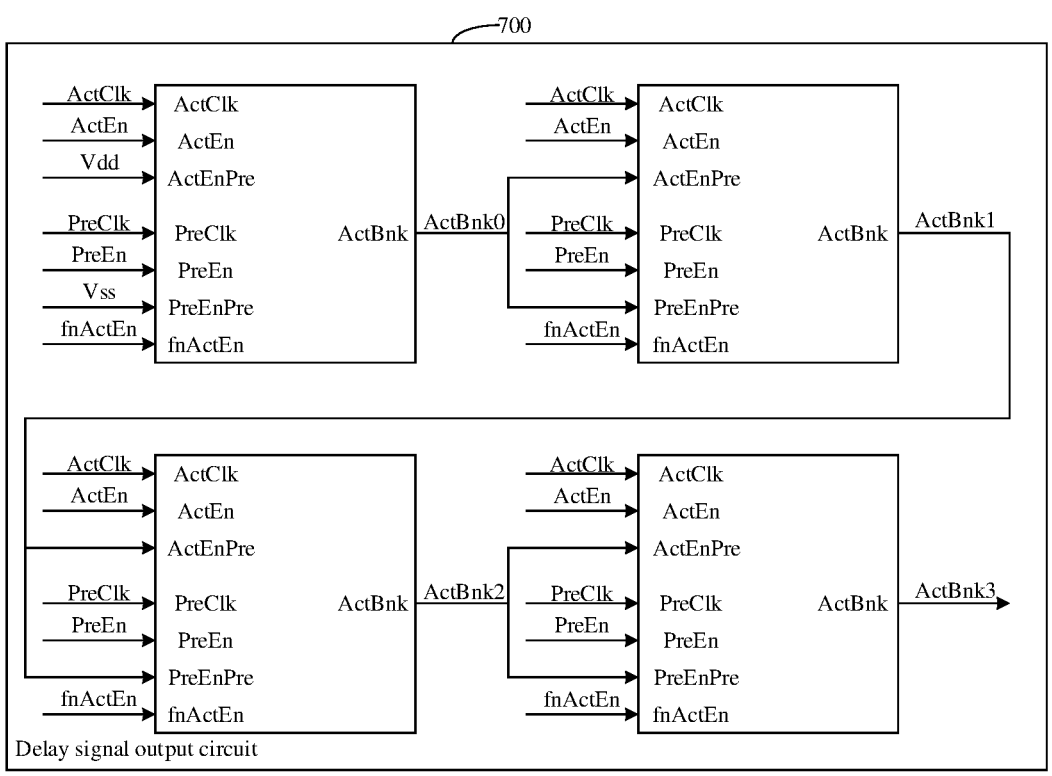
FIG. 22 is a specific schematic circuit diagram of a delay signal output circuit provided by an embodiment of this disclosure.
Figure 23:
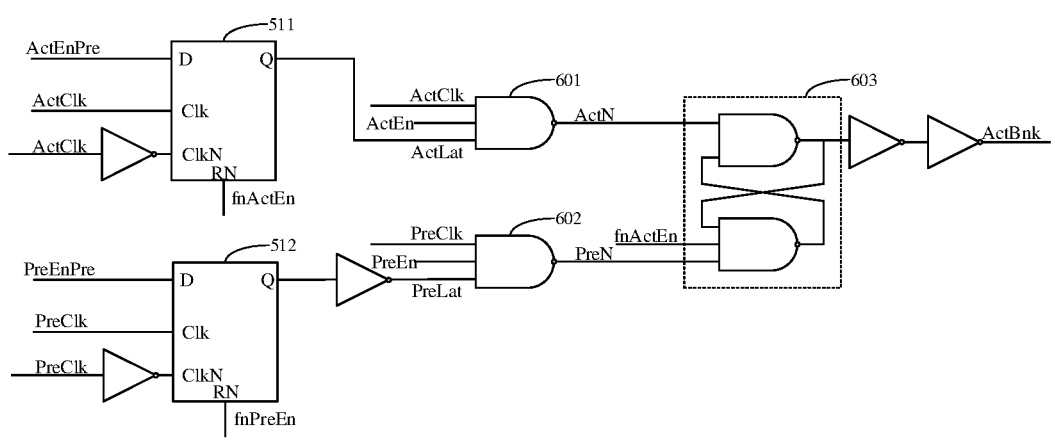
FIG. 23 is a specific schematic circuit diagram of a signal output circuit in a delay signal output circuit provided by an embodiment of this disclosure.
Figure 24:
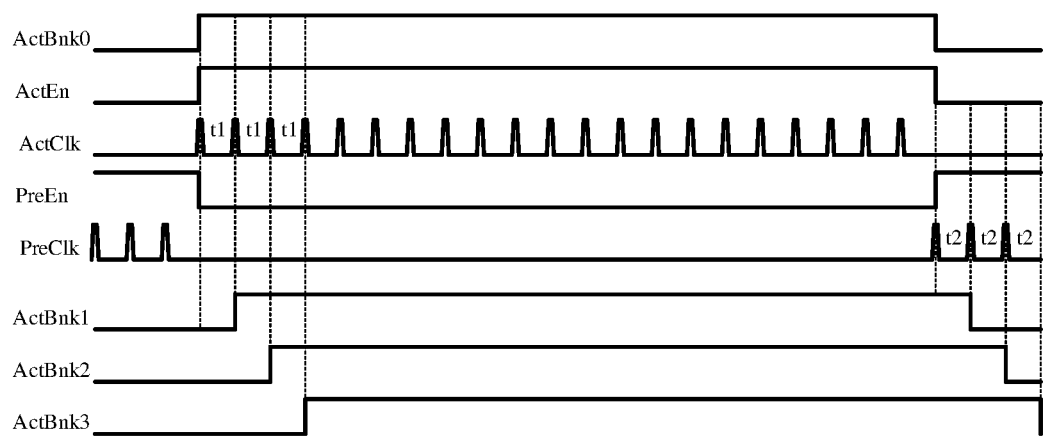
FIG. 24 is a schematic diagram of a time sequence of signals in a delay signal output circuit provided by an embodiment of this disclosure.

FIG. 1 and FIG. 2 are schematic structural diagrams of a stagger pulse generation circuit provided by an embodiment of this disclosure. FIG. 3 is a specific schematic circuit diagram of a signal generation module provided by an embodiment of this disclosure. FIG. 4 and FIG. 5 are schematic structural diagrams of a pulse generation circuit provided by an embodiment of this disclosure. FIG. 6 is a specific schematic circuit diagram of an oscillation module provided by an embodiment of this disclosure. FIG. 7 is a schematic structural diagram of a delay unit provided by an embodiment of this disclosure. FIG. 8 is a schematic structural diagram of a selection unit provided by an embodiment of this disclosure. FIG. 9 and FIG. 10 are schematic circuit diagrams of a period adjustment module provided by an embodiment of this disclosure. FIG. 11 is a schematic diagram of a time sequence of signals in a pulse generation circuit provided by an embodiment of this disclosure. FIG. 12 is a schematic diagram of a time sequence of signals in a stagger pulse generation circuit provided by an embodiment of this disclosure. FIG. 13 is a schematic structural diagram of a signal output circuit provided by an embodiment of this disclosure. FIG. 14 is a specific schematic circuit diagram of a first control module provided by an embodiment of this disclosure. FIG. 15 is a specific schematic circuit diagram of a second control module provided by an embodiment of this disclosure. FIG. 16 is a schematic structural diagram of a signal output module provided by an embodiment of this disclosure. FIG. 17 and FIG. 18 are specific schematic circuit diagrams of a signal output module provided by an embodiment of this disclosure. FIG. 19 is a schematic diagram of a time sequence of signals in a signal output circuit provided by an embodiment of this disclosure. FIG. 20 and FIG. 21 are schematic structural diagrams of a delay signal output circuit provided by an embodiment of this disclosure. FIG. 22 is a specific schematic circuit diagram of a delay signal output circuit provided by an embodiment of this disclosure. FIG. 23 is a specific schematic circuit diagram of a signal output circuit in a delay signal output circuit provided by an embodiment of this disclosure. FIG. 24 is a schematic diagram of a time sequence of signals in a delay signal output circuit provided by an embodiment of this disclosure. The stagger signal generation circuit provided in this embodiment will be further described in detail below in conjunction with the accompanying drawings.

The stagger signal generation circuit includes a stagger pulse generation circuit and a delay signal output circuit.

The stagger pulse generation circuit is configured to generate a first pulse signal ActClk according to a first control signal ActEn and generate a second pulse signal PreClk according to a second control signal PreEn. The first control signal ActEn and the second control signal PreEn are inverted signals. The first pulse signal ActClk and the second pulse signal PreClk are stagger pulse signals. The stagger pulse signals in this embodiment refer to pulse signals (the first pulse signal ActClk and the second pulse signal PreClk) generated according to the inverted signals (the first control signal ActEn and the second control signal PreEn), and may also be pulse signals that are effective in different periods.

The delay signal output circuit includes G signal output circuits, and G is an integer greater than or equal to 2. The signal output circuit is configured to receive an input signal, the first pulse signal ActClk and the second pulse signal PreClk and output a delay output signal.

Each non-first-stage signal output circuit receives the delay output signal outputted by a respective previous-stage signal output circuit as an input signal of a current-stage signal output circuit. A first-stage signal output circuit receives an initial input signal as an input signal of the first-stage signal output circuit. A rising edge of the delay output signal generated by the signal output circuit has a first delay from a rising edge of the received delay output signal outputted by the previous-stage signal output circuit. A falling edge of the delay output signal generated by the signal output circuit has a second delay from a falling edge of the received delay output signal outputted by the previous-stage signal output circuit.

In this embodiment, a pulse period of the first pulse signal ActClk is t1, a pulse period of the second pulse signal PreClk is t2, and the pulse period of the first pulse signal ActClk and the pulse period of the second pulse signal PreClk are equal. In other embodiments, the pulse periods of the first pulse signal ActClk and the second pulse signal PreClk can be different.

Specifically, referring to FIG. 1, the stagger pulse generation circuit 300 includes a signal generation module (or referred to as a signal generation circuit) 303, configured to generate a first control signal ActEn and a second control signal PreEn according to an activation signal Active. The first control signal ActEn and the second control signal PreEn are inverted signals. The activation signal Active is an externally inputted activation instruction. The signal generation module 303 is configured to generate the first control signal ActEn and the second control signal PreEn which are inverted signals according to the external activation instruction.

More specifically, referring to FIG. 2, the signal generation module 303 includes a reset unit (or referred to as a reset circuit) 313 and a reverse unit 323.

The reset unit 313 is configured to receive a first reset signal fnActEn and the activation signal Active, and generate the first control signal ActEn based on the first reset signal fnActEn and the activation signal Active.

The first reset signal fnActEn is an externally inputted reset instruction, and configured to reset the reset unit 313. Specifically, after the reset unit 313 is reset, if the activation signal Active received by the reset unit 313 is at an effective level, the reset unit 313 generates the first control signal ActEn.

The reverse unit 323 is configured to receive the first control signal ActEn, and generate the second control signal PreEn based on the first control signal ActEn.

In this embodiment, the signal generation module 303 further includes a reset signal generation unit (or referred to as a reset signal generation circuit) 333. The reset signal generation unit 333 is configured to generate a second reset signal fnPreEn according to the first reset signal fnActEn and the first control signal ActEn, so that when the first reset signal fnActEn is in a reset state, the second reset signal fnPreEn is also in a reset state, and when the first reset signal fnActEn is in a non-reset state, the second reset signal fnPreEn generates a reset narrow pulse comprised in the second reset signal fnPreEn based on a changing edge of the first control signal ActEn.

In this embodiment, the signal generation module 303 further includes a selection signal generation unit 343. The selection signal generation unit 343 is configured to receive a selection signal fnAdjDly and generate a selection signal set based on the selection signal fnAdjDly. The selection signal set includes the selection signal fnAdjDly and an inverted selection signal fnAdjDlyN. The selection signal fnAdjDly and the inverted selection signal fnAdjDlyN are inverted signals.

It is to be understood that, in this embodiment, the selection signal fnAdjDly includes a magnification selection signal fnAdjDlyx, a first selection signal fnAdjDly1 and a second selection signal fnAdjDly2 for regulating a pulse generation circuit 100.

In an example, referring to FIG. 3, the reset unit 313 includes a reset NAND gate 403 and a reset inverter 404. The reset inverter 404 is connected to an output end of the reset NAND gate 403. The reset NAND gate 403 is configured to receive the first reset signal fnActEn and the activation signal Active.

The reverse unit 323 includes an output inverter 405 connected to the reset unit 313 and configured to generate the second control signal PreEn according to the first control signal ActEn.

The reset signal generation unit 333 includes a pulse conversion device 406, an output NAND gate 407, and an output inverter 408. The pulse conversion device 406 is configured to detect a changing edge (e.g., a rising edge) of the first control signal ActEn and generate a pulse control signal. The output NAND gate 407 is further configured to receive the first reset signal fnActEn, and in this case, the output inverter 408 outputs the second reset signal fnPreEn.

The selection signal generation unit 343 includes a first selection inverter 401 and a second selection inverter 402 connected in series, The output end of the first selection inverter 401 is connected to an input end of the second selection inverter 402 for generating a selection signal set according to the selection signal fnAdjDly.

Still referring to FIG. 2, the stagger pulse generation circuit 300 further includes a first pulse generation unit (or referred to as a first pulse generation circuit) 301 and a second pulse generation unit 302. The first pulse generation unit 301 specifically includes a pulse generation circuit, configured to generate a first pulse signal ActClk according to the first control signal ActEn. The second pulse generation unit 302 specifically includes a pulse generation circuit, configured to generate a second pulse signal PreClk according to the second control signal PreEn. The first pulse signal ActClk and the second pulse signal PreClk are stagger pulse signals.

In this embodiment, the second pulse generation unit 302 and the first pulse generation unit 301 have the same circuit structure. This embodiment is described in terms of the pulse generation circuit 100 of the first pulse generation unit 301. The first control signal ActEn and the second control signal PreEn belong to the control signal RasEn. The first reset signal fnActEn and the second reset signal fnPreEn belong to the reset signal fnRasEn.

Referring to FIG. 4, the first pulse generation unit 301 includes a pulse generation circuit 100, the pulse generation circuit 100 includes an oscillation module 101 configured to receive a control signal RasEn, and generate a first oscillation signal Osc1 according to the control signal RasEn. Specifically, when the control signal RasEn is at an effective level, the oscillation module 101 generates a first oscillation signal Osc1. In this embodiment, it is assumed that a period of the first oscillation signal Osc1 is T.

In an example, when the control signal RasEn is received, and the control signal RasEn is at the effective level, the oscillation module 101 oscillates to generate the first oscillation signal Osc1.

Furthermore, referring to FIG. 5, the oscillation module 101 includes an oscillation unit (or referred to as an oscillation circuit) 111 and a trigger unit (or referred to as a trigger circuit) 121 connected in the oscillation unit 111. The trigger unit 121 is configured to receive the reset signal fnRasEn and the control signal RasEn, and trigger the oscillation unit 111 based on the reset signal fnRasEn and the control signal RasEn. After being triggered, the oscillation unit 111 generates the first oscillation signal Osc1 according to the control signal RasEn.

It is to be understood that in the feature "triggering the oscillation unit 111 based on the reset signal fnRasEn and the control signal RasEn" described here, the meaning of "based on" includes, but is not limited to: when the reset signal fnRasEn is in a non-reset state and the control signal RasEn is at the effective level, the trigger unit 121 triggers the oscillation unit 111.

The reset signal fnRasEn is an externally inputted reset instruction, and configured to reset the trigger unit 121. Specifically, after the trigger unit 121 is reset, if the control signal RasEn received by the trigger unit 121 is at an effective level, the trigger unit 121 triggers the oscillation unit 111, so that the oscillation unit 111 generates the first oscillation signal Osc1.

In an example, referring to FIG. 6, the oscillation unit 111 includes a ring oscillator formed by A inverters connected in series, and A is a positive odd number. A can be 5, 7, 9, 11, etc. In this embodiment, A=7, that is, a ring oscillator formed by connecting seven inverters in series is taken as an example for illustration, which does not constitute a limitation to this embodiment. In specific applications, the number of inverters in the ring oscillator can be selected according to actual needs. The trigger unit 121 includes a first NAND gate 211 and a second NAND gate 212. The output end of the first NAND gate 211 is connected to an input end of the second NAND gate 212, and an input end of the first NAND gate 211 and an output end of the second NAND gate 212 are configured to connect the ring oscillator. One of the first NAND gate 211 and the second NAND gate 212 is configured to receive the control signal RasEn, and another one is configured to receive the reset signal fnRasEn. It is to be understood that the first NAND gate 211 given in FIG. 3 is configured to receive the control signal RasEn, and the second NAND gate 212 is configured to receive the reset signal fnRasEn, which does not constitute a limitation of this embodiment. In other embodiments, the second NAND gate may be configured to receive the control signal, and the first NAND gate may receive the reset signal.

In this embodiment, the oscillation module 101 further includes a first inverter set 215 and a first selection unit (or referred to as a first selection circuit, not illustrated in figures). The first inverter set 215 includes B inverters connected in series, and B is a positive even number. B can be 2, 4, 6, etc. In this embodiment, B=2, that is, the first inverter set 215 formed by two inverters connected in series is taken as an example for illustration, which does not constitute a limitation to this embodiment. In specific applications, the number of inverters in the first inverter set 215 can be selected according to actual needs. The first selection unit is configured to receive a first selection signal fnAdjDly1, and connect the first inverter set 215 in series between adjacent inverters in the ring oscillator based on the first selection signal fnAdjDly1.

Specifically, the purpose of providing B inverters in the first inverter set 215 is to ensure that the total number of inverters in the ring oscillator is an odd number. Specifically, the first selection unit (not illustrated in figures) includes a first selector 214, and the first selector 214 is configured to gate a first branch or a second branch according to the first selection signal fnAdjDly1 and the inverted first selection signal fnAdjDly1N. The first branch serves as a connecting circuit of adjacent inverters in the ring oscillator, and the second branch connects the first inverter set 215 in series to the connecting circuit of the adjacent inverters of the ring oscillator. The purpose of connecting the first inverter set 215 to the ring oscillator is to increase the number of inverters in the ring oscillator, thereby increasing the period of the first oscillation signal Osc1 generated by the oscillation unit 111. In this embodiment, it is assumed that after the inverters of the first inverter set 215 are increased, the generated first oscillation signal Osc1 is 1.2 T. Since connecting the first inverter set 215 to the ring oscillator is controlled by the first selection signal fnAdjDly1, the period of the first oscillation signal Osc1 generated by the oscillation unit 111 can be adjusted by the externally inputted first selection signal fnAdjDly1.

In this embodiment, the oscillation module 101 further includes a second inverter set 217 and a second selection unit (not illustrated in figures). The second inverter set 217 includes C inverters connected in series, and C is a positive even number. C can be 2, 4, 6, etc. In this embodiment, C=4, that is, the second inverter set 217 formed by four inverters connected in series is taken as an example for illustration, which does not constitute a limitation to this embodiment. In specific applications, the number of inverters in the second inverter set 217 can be selected according to actual needs. The second selection unit is configured to receive a second selection signal fnAdjDly2, and connect the second inverter set 217 in series between adjacent inverters of the ring oscillator based on the second selection signal fnAdjDly2.

Specifically, the purpose of providing C inverters in the second inverter set 217 is to ensure that the total number of inverters in the ring oscillator is an odd number. Specifically, the second selection unit (not illustrated in figures) includes a second selector 216, and the second selector 216 is configured to gate a third branch or a fourth branch according to the second selection signal fnAdjDly2 and the inverted second selection signal fnAdjDly2N. The third branch serves as a connecting circuit of adjacent inverters in the ring oscillator, and the fourth branch connects the second inverter set 217 in series to the connecting circuit of the adjacent inverters of the ring oscillator. The purpose of connecting the second inverter set 217 to the ring oscillator is to increase the number of inverters in the ring oscillator, thereby increasing the period of the first oscillation signal Osc1 generated by the oscillation unit 111. In this embodiment, it is assumed that after the inverters of the second inverter set 217 are increased, the generated first oscillation signal Osc1 is 1.4 T. Since connecting the second inverter set 217 to the ring oscillator is controlled by the second selection signal fnAdjDly2, the period of the first oscillation signal Osc1 generated by the oscillation unit 111 can be adjusted by the externally inputted second selection signal fnAdjDly2.

In this embodiment, B and C can be set to any positive even numbers. In specific applications, the values of B and C can be set reasonably according to the changes required by the first oscillation signal Osc1 generated by the oscillation unit 111. Furthermore, this embodiment describes the implementation of two inverter sets, and the implementations of continuing to add a third inverter set and a fourth inverter set on the basis of this embodiment should fall within the protection scope of this disclosure.

Furthermore, it is possible to change the period of the first oscillation signal Osc1 with different amplitudes by simultaneously connecting the first inverter set 215 and the second inverter set 217 to the ring oscillator, and in this case, the period table 1 of the first oscillation signal Osc1 generated according to the combination of different first selection signal fnAdjDly1 and different second selection signal fnAdjDly2 is shown as follows:

TABLE 1

Period Table of Osc1

| fnAdjDly1 | fnAdjDly2 | Period of Osc1 |
|---|---|---|
| 0 | 0 | T |
| 1 | 0 | 1.2 T |
| 0 | 1 | 1.4 T |
| 1 | 1 | 1.6 T |

Still referring to FIG. 4, the pulse generation circuit 100 includes a period adjustment module 102, and the period adjustment module 102 is configured to receive the first oscillation signal Osc1 and the magnification selection signal fnAdjDlyx, and output a second oscillation signal Osc2. A period of the second oscillation signal Osc2 is a period of the first oscillation signal Osc1 or a period of an oscillation adjustment signal, and the second oscillation signal is selected according to the magnification selection signal fnAdjDlyx. The magnification selection signal fnAdjDlyx is an externally inputted selection instruction for adjusting the period of the second oscillation signal Osc2. That is, the pulse generation circuit can adjust, through the externally inputted magnification selection signal fnAdjDlyx, the period of the second oscillation signal Osc2 generated by the period adjustment module 102.

In an example, an oscillation adjustment signal OscT may be generated by using the first oscillation signal Osc1, and then according to the magnification selection signal fnAdjDly, the first oscillation signal Osc1 may be selected as the second oscillation signal Osc2 to output, or the oscillation adjustment signal OscT may be selected as the second oscillation signal Osc2 to output. It is also possible to determine whether to generate the oscillation adjustment signal OscT according to the magnification selection signal fnAdjDlyx. That is, the second oscillation signal Osc2 is outputted in a manner of determining before generating.

Referring to FIG. 5, the period adjustment module 102 includes a delay unit (or referred to as a delay circuit) 112 and a selection unit (or referred to as a selection circuit) 122. The delay unit 112 receives the first oscillation signal Osc1 and generates an oscillation adjustment signal OscT based on the first oscillation signal Osc1. A period of the oscillation adjustment signal OscT is different from the period of the first oscillation signal Osc1. The selection unit 122 receives the magnification selection signal fnAdjDlyx and selects the first oscillation signal Osc1 or the oscillation adjustment signal OscT as the second oscillation signal Osc2 based on the magnification selection signal fnAdjDlyx.

In an example, referring to FIG. 7, the delay unit 112 includes a D flip-flop 201. The D flip-flop includes an input end D, clock ends Clk and ClkN, a reset end RN, and an output end Q. The clock ends Clk and ClkN are configured to receive the first oscillation signal Osc1 and the inverted first oscillation signal Osc1N. The reset end RN is configured to receive the reset signal fnRasEn. The output end Q is connected to the triggering inverter 202 in series and is connected to the input end D, and is configured to output the oscillation adjustment signal OscT. Those skilled in the art know that the period of the oscillation adjustment signal OscT outputted in this case is twice the period of the first oscillation signal Osc1.

Referring to FIG. 8, the selection unit 122 includes a magnification selector 203. The magnification selector 203 includes a first selection input end, a second selection input end, a selection signal end, and a selection output end. The first selection input end and the second selection input end are configured to receive the first oscillation signal Osc1 and the oscillation adjustment signal OscT respectively. The selection signal end is configured to receive the magnification selection signal fnAdjDlyx and the inverted magnification selection signal fnAdjDlyxN. The selection output end is configured to output the second oscillation signal Osc2. The period of the oscillation signal can be dramatically changed through the magnification selection signal fnAdjDlyx. In this embodiment, the first oscillation signal Osc1 is received by the first selection input end, and the oscillation adjustment signal OscT is received by the second selection input end. In other embodiments, the first oscillation signal OscT is received by the first selection input end, and the first oscillation signal Osc1 is received by the second selection input end.

In this case, the period of the second oscillation signal Osc2 generated according to the difference of the first selection signal fnAdjDly1, the second selection signal fnAdjDly2, and the magnification selection signal fnAdjDlyx is as shown in Table 2:

TABLE 2

| Period Table of Osc2 | | | |
|---|---|---|---|
| fnAdjDlyx | fnAdjDly1 | fnAdjDly2 | Period of Osc2 |
| 0 | 0 | 0 | T |
| 0 | 1 | 0 | 1.2 T |
| 0 | 0 | 1 | 1.4 T |
| 0 | 1 | 1 | 1.6 T |
| 1 | 0 | 0 | 2 T |
| 1 | 1 | 0 | 2.4 T |
| 1 | 0 | 1 | 2.8 T |
| 1 | 1 | 1 | 3.2 T |

In this embodiment, the delay unit 112 includes E delay subunits (or referred to as a delay sub-circuit) connected in series. The oscillation adjustment signal OscT includes E delay signals, and E is a positive integer. The first-stage delay subunit is configured to generate a first delay signal Osc11 according to the first oscillation signal Osc1, and input the first delay signal Osc11 into a second-stage delay subunit. The $F^{th}$-stage delay subunit is configured to generate an $F^{th}$ delay signal Osc1F according to a $(F-1)^{th}$-stage delay signal Osc1F-1, and F is a positive integer less than or equal to E and greater than or equal to 2.

Specifically, the $F^{th}$-stage delay subunit includes a D flip-flop. The D flip-flop includes an input end, a clock ends, a reset end, and an output end. The clock ends are configured to receive the $(F-1)^{th}$ delay signal Osc1F-1 and the inverted $(F-1)^{th}$ delay signal Osc1F-1N. The reset end is configured to receive a reset signal. The output end is connected to the triggering inverter in series and connected to the input end, and is configured to output the $F^{th}$ delay signal Osc1F. Those skilled in the art know that the period of the $F^{th}$ delay signal Osc1F outputted in this case is twice the period of the $(F-1)^{th}$ delay signal Osc1F-1.

Referring to FIG. 9, the delay unit 112 includes three delay subunits connected in series, namely a first-stage delay subunit 221, a second-stage delay subunit 223, and a third-stage delay subunit 225, respectively. The first-level delay subunit 221 is configured to generate the first delay signal Osc11 according to the first oscillation signal Osc1. The period of the first delay signal Osc11 is twice the period of the first oscillation signal Osc1. The second-stage delay subunit 223 is configured to generate the second delay signal Osc12 according to the first delay signal Osc11. The period of the second delay signal Osc12 is twice the period of the first delay signal Osc11. The third-stage delay subunit 225 is configured to generate the third delay signal Osc13 according to the second delay signal Osc12. The period of the third delay signal Osc13 is twice the period of the second delay signal Osc12.

In an example, the operation that the selection unit 122 selects the first oscillation signal Osc1 or the oscillation adjustment signal OscT as the second oscillation signal Osc2 based on the magnification selection signal fnAdjDlyx includes: selecting an $(E-1)^{th}$ delay signal Osc1E-1 or an $E^{th}$ delay signal Osc1E as the second oscillation signal Osc2 based on the magnification selection signal fnAdjDlyx.

In this embodiment, the operation that the selection unit 122 selects the first oscillation signal Osc1 or the oscillation adjustment signal OscT as the second oscillation signal Osc2 based on the magnification selection signal fnAdjDlyx includes: selecting the second delay signal Osc12 or the third delay signal Osc13 as the second oscillation signal Osc2 based on the magnification selection signal fnAdjDlyx. The first-stage delay subunit 221 and the second-stage delay subunit 223 are configured to expand the period of the outputted second oscillation signal Osc2.

In this case, the period of the second oscillation signal Osc2 generated according to the difference of the first selection signal fnAdjDly1, the second selection signal fnAdjDly2, and the magnification selection signal fnAdjDlyx is as shown in Table 3:

TABLE 3

Period Table of Osc2

| fnAdjDlyx | fnAdjDly1 | fnAdjDly2 | Period of Osc2 |
|---|---|---|---|
| 0 | 0 | 0 | 4 T |
| 0 | 1 | 0 | 4.8 T |
| 0 | 0 | 1 | 5.6 T |
| 0 | 1 | 1 | 6.4 T |
| 1 | 0 | 0 | 8 T |
| 1 | 1 | 0 | 9.6 T |
| 1 | 0 | 1 | 11.2 T |
| 1 | 1 | 1 | 12.8 T |

In another example, the selection unit 122 includes E selection subunits connected in series. The magnification selection signal fnAdjDlyx includes a respective sub-magnification selection signal corresponding to each selection subunit. The first-stage selection subunit is configured to select the first oscillation signal Osc1 or the first delay signal Osc11 to input into the second-stage selection subunit according to the corresponding sub-magnification selection signal. The $F^{th}$-stage selection subunit is configured to select an output signal of an $(F-1)^{th}$-stage selection subunit or the $F^{th}$ delay signal Osc1F to input to an $(F+1)^{th}$-stage selection subunit according to the corresponding sub-magnification selection signal. The $E^{th}$-stage selection subunit is configured to select an output signal of an $(E-1)^{th}$-stage selection subunit or the oscillation adjustment signal OscT as the second oscillation signal Osc2 according to the corresponding sub-magnification selection signal. F is a positive integer less than E and greater than or equal to 2. That is, the first selection input end and the second selection input end of the selection unit 122 are configured to receive one signal in the oscillation adjustment signal (the first delay signal Osc11, the second delay signal Osc12, . . . , and the $F^{th}$ delay signal Osc1F) or the first oscillation signal Osc1, respectively, and select one signal in the oscillation adjustment signal (the first delay signal Osc11, the second delay signal Osc12, . . . , and the $F^{th}$ delay signal Osc1F) or one signal in the first oscillation signal Osc1 as the second oscillation signal Osc2.

Specifically, the $F^{th}$-stage selection subunit includes a magnification selector. The magnification selector includes a first selection input end, a second selection input end, a selection signal end, and a selection output end. The first selection input end and the second selection input end are configured to receive the output signal of the $(F-1)^{th}$-stage selection subunit and the $F^{th}$ delay signal Osc1F respectively. The selection signal end is configured to receive a corresponding sub-magnification selection signal. The selection output end is configured to output the output signal of the $(F-1)^{th}$-stage selection subunit or the $F^{th}$ delay signal Osc1F. In this embodiment, the first selection input end is used to receive the output signal of the $(F-1)^{th}$-stage selection subunit, and the second selection input end is used to receive the $F^{th}$ delay signal Osc1F. In other embodiments, the first selection input end is used to receive the $F^{th}$ delay signal Osc1F, and the second selection input end is used to receive the output signal of the $(F-1)^{th}$-stage selection subunit.

Referring to FIG. 10, the selection unit 122 includes three selection subunits connected in series, namely a first-stage selection subunit 227, a second-stage selection subunit 228, and a third-stage selection subunit 229, respectively. The first-stage selection subunit 227 is configured to select the first oscillation signal Osc1 or the first delay signal Osc11 to input into the second-stage selection subunit 228. The second-stage selection subunit 228 is configured to select the output signal of the first-stage selection subunit 227 or the second delay signal Osc12 to input into the third-stage selection subunit 229. The third-stage selection subunit 229 is configured to select the output signal of the second-stage selection subunit 228 or the third delay signal Osc13 as the oscillation adjustment signal OscT. More selection of changes of the period of the second oscillation signal Osc2 is implemented through the series connection of multiple selection subunits.

It is to be understood that in the specific application process, the magnification selection signal fnAdjDlyx, the first selection signal fnAdjDly1, and the second selection signal fnAdjDly2 can be implemented by a multi-bit binary number. That is, the selection signal is a multi-bit binary number, in which one bit is used as the magnification selection signal fnAdjDlyx, one bit is used as the first selection signal fnAdjDly1, and one bit is used as the second selection signal fnAdjDly2.

Still referring to FIG. 4, the pulse generation circuit 100 includes a pulse conversion module (or referred to as a pulse conversion circuit) 103. The pulse conversion module 103 is configured to receive the second oscillation signal Osc2 and output a pulse signal OscClk. A pulse of the pulse signal OscClk is generated based on a rising edge or a falling edge of the second oscillation signal, and a pulse period of the pulse signal OscClk is the same as a period of the second oscillation signal.

Specifically, referring to FIG. 5, the pulse conversion module 103 includes a pulse converter 113. The pulse converter 113 is configured to receive the second oscillation signal Osc2 and generate a pulse signal OscClk based on the second oscillation signal Osc2.

In an example, when detecting the rising edge of the second oscillation signal Osc2, the pulse converter 113 outputs an upward narrow pulse. The output end of the pulse converter 113 can also be connected in series to an inverter to output a downward narrow pulse. In another example, when detecting the rising edge of the second oscillation signal Osc2, the pulse converter 113 outputs a downward narrow pulse. The output end of the pulse converter 113 can also be connected in series to an inverter to output an upward narrow pulse. Furthermore, in this embodiment, the pulse converter 113 operates based on the rising edge of the second oscillation signal Osc2. In other embodiments, the pulse converter may operate based on the falling edge of the second oscillation signal.

It is to be understood that in the feature "generating the pulse signal OscClk based on the second oscillation signal Osc2" described herein, the meaning of "based on" includes, but is not limited to: generating a narrow pulse of the pulse signal OscClk after the rising edge of the second oscillation signal Osc2 is detected, or the second oscillation signal Osc2 is detected to change from a low level to a high level (a high level to a low level).

It is to be understood that in this embodiment, the pulse signal OscClk is generated based on the rising edge of the second oscillation signal Osc2. In other embodiments, the pulse signal may be generated based on the falling edge of the second oscillation signal.

Referring to FIG. 11, during the period that the control signal RasEn is at an effective level, the oscillation module 101 generates a first oscillation signal Osc1 with a period of T, and the period adjustment module 102 adjusts the period of the second oscillation signal Osc2 (Osc2') according to the magnification selection signal fnAdjDlyx.

Specifically, if the magnification selection signal fnAdjDlyx is changed during the period that the control signal RasEn is at the effective level, there is a period change for the second oscillation signal Osc2 generated in this case. Assume that the period changes from a period T to a period 2 T, the pulse period of the pulse signal OscClk generated in this case also changes from the period T to the period 2 l. If the magnification selection signal fnAdjDlyx is changed before the control signal RasEn is at the effective level, there is no period change for the second oscillation signal Osc2' generated in this case, and the pulse period of the generated pulse signal OscClk' does not have a pulse period change.

Referring to FIG. 12, when the activation signal Active is at an effective level, the generated first control signal ActEn is at the effective level. The first pulse generation unit 301 is configured to generate the first oscillation signal Osc1 with a period of T and the second oscillation signal Osc2 with a period of 2 T according to the first control signal ActEn. In this embodiment, the second oscillation signal Osc2 and the first oscillation signal Osc1 have a same period, and the first pulse signal ActClk is generated based on the rising edge of the second oscillation signal Osc2. The second pulse generation unit 302 is configured to generate a first oscillation signal Osc1" with a period of T and a second oscillation signal Osc2" with a period of 2 T according to the second control signal PreEn. In this embodiment, the second oscillation signal Osc2" and the first oscillation signal Osc1" has a same period, and the second pulse signal PreClk is generated based on the rising edge of the second oscillation signal Osc2". At this case, the first pulse signal ActClk and the second pulse signal PreClk generated are stagger pulse signals.

Specifically, the delay signal output circuit includes G signal output circuits 500, and G is an integer greater than or equal to 2. The signal output circuit is configured to receive an input signal, the first pulse signal ActClk and the second pulse signal PreClk, and output a delay output signal. Each non-first-stage signal output circuits receives the delay output signal outputted by a respective previous-stage signal output circuit as an input signal of a current-stage signal output circuit. The first-stage signal output circuit receives an initial input signal as an input signal of the first-stage signal output circuit. A rising edge of the delay output signal generated by the signal output circuit has a first delay from a rising edge of the received delay output signal outputted by the previous-stage signal output circuit or the initial input signal. A falling edge of the delay output signal generated by the signal output circuit has a second delay from a falling edge of the received delay output signal outputted by the previous-stage signal output circuit or the initial input signal.

Specifically, referring to FIG. 13, the signal output circuit 500 includes a first control module (or referred to as a first control circuit) 501. The first control module 501 is configured to receive the first pulse signal ActClk and the input signal ActBnk0, and output a first adjustment signal ActLat.

A first preset edge of the first adjustment signal ActLat has a first delay with respect to a rising edge of the input signal ActBnk0. The first delay is a pulse period of the first pulse signal ActClk.

In an example, the rising edge or falling edge of the first pulse signal ActClk can be utilized to sample the input signal ActBnk0, and then output the first adjustment signal ActLat. Or after the rising edge or falling edge of the first pulse signal ActClk is detected, the input signal ActBnk0 is outputted in a delay manner, to obtain the first adjustment signal ActLat.

In this embodiment, taking the first preset edge being the rising edge as an example for illustration. Specifically, the input signal ActBnk0 is an external input signal (compared to the signal output circuit 500), and the signal output circuit 500 is configured to generate the delay output signal ActEnk" according to the input signal ActBnk0. The rising edge of the delay output signal ActBnk1 is generated based on the rising edge of the first adjustment signal ActLat, and the rising edge of the first adjustment signal ActLat has a first delay from the rising edge of the input signal ActBnk0. That is, the rising edge of the delay output signal ActBnk1 has a first delay from the rising edge of the input signal ActBnk0, and the first delay is the pulse period of the first pulse signal ActClk. It can be seen that the externally inputted first pulse signal ActClk is configured to adjust the delay of the rising edge of the delay output signal ActBnk1. It is to be understood that in other embodiments, the first preset edge may also be a falling edge.

It is to be understood that, in the feature "the rising edge of the delay output signal ActBnk1 is generated based on the first preset edge of the first adjustment signal ActLat" described herein, the meaning of "based on" includes, but is not limited to: the rising edge of the delay output signal ActBnk1 is generated when the first preset edge of the first adjustment signal ActLat is detected, or the rising edge of the delay output signal ActBnk1 is generated after it is detected that the first adjustment signal ActLat changes from a low level to a high level (a high level to a low level).

In an example, referring to FIG. 14, the first control module 501 includes a first D flip-flop 511. A clock end is configured to receive the first pulse signal ActClk. A reset end is configured to receive the first reset signal fnActEn. An input end is configured to receive the input signal ActBnk0. An output end is configured to output the first adjustment signal ActLat.

Still referring to FIG. 13, the signal output circuit 500 further includes a second control module (or referred to as a second control circuit) 502. The second control module 502 is configured to receive the second pulse signal PreClk and the input signal ActBnk0, and output a second adjustment signal PreLat. A second preset edge of the second adjustment signal PreLat has a second delay with respect to a falling edge of the input signal ActBnk0. The second delay is a pulse period of the second pulse signal PreClk.

In this embodiment, taking the second preset edge being the rising edge as an example for illustration, specifically, the falling edge of the delay output signal ActBnk1 is generated based on the rising edge of the second adjustment signal PreLat, and the rising edge of the second adjustment signal PreLat has a second delay from the falling edge of the input signal ActBnk0. That is, the falling edge of the delay output signal ActBnk1 has a second delay from the falling edge of the input signal ActBnk0, and the second delay is the pulse period of the second pulse signal PreLat. It can be seen that the externally inputted second pulse signal PreLat is configured to adjust the delay of the falling edge of the delay output signal ActBnk1. It is to be understood that in other embodiments, the second preset edge may also be a falling edge.

It is to be understood that, in the feature "the falling edge of the delay output signal ActBnk1 is generated based on the second preset edge of the second adjustment signal PreLat" described herein, the meaning of "based on" includes, but is not limited to: the falling edge of the delay output signal ActBnk1 is generated when the second preset edge of the second adjustment signal PreLat is detected, or the falling edge of the delay output signal ActBnk1 is generated after it is detected that the second adjustment signal PreLat changes from a low level to a high level (a high level to a low level).

In an example, referring to FIG. 15, the second control module 502 includes a second D flip-flop 512. A clock end is configured to receive the second pulse signal PreClk. A reset end is configured to receive the second reset signal fnPreEn. An input end is configured to receive the input signal ActBnk0. An output end is connected to the inverter in series to output the second adjustment signal PreLat.

Furthermore, in this embodiment, one of the pulses of the first pulse signal ActClk is aligned with the rising edge of the input signal ActBnk0, and one of the pulses of the second pulse signal PreClk is aligned with the falling edge of the input signal ActBnk0. It is to be understood that the "alignment" described herein is not necessarily perfect alignment under ideal conditions, and may include subtle differences in rising/falling edges due to factors such as circuit delays. The accuracy of the first delay between a first signal edge of the first adjustment signal ActLat and the rising edge of the input signal ActBnk0 may be ensured by aligning one of the pulses of the first pulse signal ActClk with the rising edge of the input signal ActBnk0 to ensure. The accuracy of the second delay between a second signal edge of the second adjustment signal PreLat and the falling edge of the input signal ActBnk0 may be ensured by aligning one of the pulses of the pulse signal PreClk with the falling edge of the input signal ActBnk0 to ensure.

Still referring to FIG. 13, the signal output circuit 500 further includes a signal output module (or referred to as a signal output circuit) 503. The signal output module 503 is configured to receive the first adjustment signal ActLat and the second adjustment signal PreLat, and output a delay output signal ActBnk1. A rising edge of the delay output signal ActBnk1 is generated based on the first preset edge of the first adjustment signal ActLat. A falling edge of the delay output signal ActBnk1 is generated based on the second preset edge of the second adjustment signal PreLat.

Specifically, referring to FIG. 16, the signal output module 503 includes a first receiving unit (or referred to as a first receiving circuit) 513, a second receiving unit (or referred to as a second receiving circuit) 523, and a latch unit (or referred to as a latch circuit) 533. The first receiving unit 513 is configured to receive the first pulse signal ActClk and the first adjustment signal ActLat, and generate a first pulse control signal ActN during a period that the first adjustment signal ActLat is at an effective level. The first pulse control signal ActN and the first pulse signal ActClk have a same pulse phase. The second receiving unit 523 is configured to receive the second pulse signal PreClk and the second adjustment signal PreLat, and generate a second pulse control signal PreN during a period that the second adjustment signal PreLat is at an effective level. The second pulse control signal Pre has a same pulse phase as the second pulse signal PreClk. The latch unit 533 is configured to receive the first pulse control signal ActN and the second pulse control signal PreN, and generate the delay output signal ActBnk1.

In an example, when it is detected that the first adjustment signal ActLat is at an effective level, the first pulse control signal ActN is generated through the first pulse signal ActClk based on the inverter. When it is detected that the second adjustment signal PreLat is at an effective level, the second pulse control signal PreN is generated through the second pulse signal PreClk based on the inverter.

In an example, referring to FIG. 17, the first receiving unit 513 includes a first receiving NAND gate 601. The first receiving NAND gate 601 includes a first input end, a second input end, and a first output end. The first input end is configured to receive the first adjustment signal ActLat. The second input end is configured to receive the first pulse signal ActClk. The first output end is configured to output the first pulse control signal ActN. The second receiving unit 523 includes a second receiving NAND gate 602. The second receiving NAND gate 602 includes a third input end, a fourth input end, and a second output end. The third input end is configured to receive the second adjustment signal PreLat. The fourth input end is configured to receive the second pulse signal PreClk. The second output end is configured to output the second pulse control signal PreN. The latch unit 533 includes a latch 603. The latch 603 includes a fifth input end, a sixth input end, and a third output end. The fifth input end is configured to receive the first pulse control signal ActN. The sixth input end is configured to receive the second pulse control signal PreN. The third output end is configured to output the delay output signal ActBnk1.

The latch unit 603 is configured such that when the first pulse control signal ActN and the second pulse control signal PreN are at different levels, the delay output signal ActBnk1 and the second pulse control signal PreN are at the same level, and when the first pulse control signal ActN and the second pulse control signal PreN are at the high level, the latch unit 603 maintains the state.

Specifically, when the first pulse signal ActN and the second pulse control signal PreN are at a high level, the latch unit 603 maintains the state. When the first pulse control signal ActN is at a high level and the second pulse signal control signal PreN is at a low level, the latch unit 603 is at a low level. When the first pulse control signal ActN is at a low level and the second pulse signal control signal PreN is at a high level, the latch unit 603 is at a high level.

In another example, the first receiving unit 513 is further configured to receive the first control signal ActEn, and generate the first pulse control signal ActN according to the first pulse signal ActClk during a period that the first adjustment signal ActLat and the first control signal ActEn are at an effective level. The second receiving unit 523 is further configured to receive the second control signal PreEn, and generate a second pulse control signal PreN according to the second pulse signal PreClk during a period that the second adjustment signal PreLat and the second control signal PreEn are at an effective level.

Referring to FIG. 18, the first receiving NAND gate 601 is further configured to receive a first control signal ActEn, and generate the first pulse control signal ActN according to the first clock signal ActClk, the first control signal ActEn, and the first adjustment signal ActLat. The second receiving NAND gate 602 is further configured to receive a second control signal PreEn, and generate a second pulse control signal PreN according to the second clock signal PreClk, the second control signal PreEn, and the second adjustment signal PreLat. The first control signal ActEn and the second control signal PreEn are inverted signals. The first pulse signal ActClk exists during the period that the first control signal ActEn is at the effective level, and the second pulse signal PreClk exists during the period that the second control signal PreEn is at the effective level. The first control signal ActEn and the second control signal PreEn are received by the first receiving NAND gate 601 and the second receiving NAND gate respectively, so as to ensure the stability of the output of the first receiving NAND gate 601 and the second receiving NAND gate 602.

Further, the first pulse signal ActClk and the second pulse signal PreClk are stagger pulse signals, and the stagger pulse signals are pulse signals generated according to the inverted signals. In this embodiment, the first pulse signal ActClk exists during the period that the first control signal ActEn is at the effective level, and a start pulse of the first pulse signal ActClk is aligned with the rising edge of the first control signal ActEn. The second pulse signal PreClk exists during the period that the second control signal PreEn is at the effective level, and a start pulse of the second pulse signal PreClk is aligned with the rising edge of the second control signal PreEn. It is to be understood that the "alignment" described herein is not necessarily perfect alignment under ideal conditions, and may include subtle differences in rising/falling edges due to factors such as circuit delays.

In an example, referring to FIG. 19, the input signal ActBnk0, the first pulse signal ActClk, and the second pulse signal PreClk are external input signals. It is assumed that the period of the first pulse signal ActClk is t1, and the period of the second pulse signal PreClk is t2. With reference to FIG. 15, the first adjustment signal ActLat is generated based on the input signal ActBnk0 and the first pulse signal ActClk. When the first pulse signal ActClk is at a high level, the state of the first adjustment signal ActLat is the current state of the input signal ActBnk0, resulting a first delay between the rising edge of the first adjustment signal ActLat and the rising edge of the input signal ActBnk0. The first delay is the period of the first pulse signal ActClk. That is, the delay between the rising edge of the first adjustment signal ActLat and the rising edge of the input signal ActBnk0 is t1. With reference to FIG. 16, the second adjustment signal PreLat is generated based on the input signal ActBnk0 and the second pulse signal PreClk. When the second pulse signal PreClk is at a high level, the state of the second adjustment signal PreLat is the current state of the input signal ActBnk0, resulting in a second delay between the rising edge of the second adjustment signal PreLat and the falling edge of the input signal ActBnk0. The second delay is the period of the second pulse signal PreClk. That is, the delay between the rising edge of the second adjustment signal PreLat and the falling edge of the input signal ActBnk0 is t2. With reference to FIG. 18, in order to ensure the stability of the outputs of the first receiving NAND gate 601 and the second receiving NAND gate 602, the first receiving NAND gate 601 is further configured to receive the first control signal ActEn, and the second receiving NAND gate 602 is further configured to receive a second control signal PreEn. The first control signal ActEn and the second control signal PreEn are inverted signals. In this case, the first receiving NAND gate 601 and the second receiving NAND gate 602 generate the first pulse control signal ActN and the second pulse control signal PreN respectively. The latch unit 603 generates a delay output signal ActBnk1 according to the first pulse control signal ActN and the second pulse control signal PreN. The rising edge of the delay output signal ActBnk1 has a first delay from the rising edge of the input signal ActBnk0, and the first delay is the pulse period t1 of the first pulse signal ActClk. The falling edge of the delay output signal ActBnk1 has a second delay from the falling edge of the input signal ActBnk0, and the second delay is the pulse period t2 of the second pulse signal PreClk. In this embodiment, the first pulse signal ActClk has an equal pulse period as the second pulse signal PreClk. That is, the signal changing edge of the delay output signal ActBnk1 has an equal time delay with respect to the signal changing edge of the input signal ActBnk0.

It is to be understood that the timing diagram of each signal illustrated in FIG. 7 is only used for interpreting the circuit function of the signal output circuit 500 provided in this embodiment, and does not constitute a limitation to this embodiment. In other embodiments, the corresponding delay input signal may be generated according to other input signals. Furthermore, the input signal may also be inconsistent with the first control signal.

It is to be understood that in other embodiments, the signal output circuit further includes an even number of inverters, and the inverters are connected to the output end of the signal output module in series to enhance the driving capability of the signal output circuit.

Referring to FIG. 20, in this embodiment, the delay signal output circuit 700 including seven signal output circuits 500 is taken as an example for specific description, and does not constitute a limitation to this embodiment, specifically, namely a first-stage signal output circuit 701, a second-stage signal output circuit 702, a third-stage signal output circuit 703, a fourth-stage signal output circuit 704, a fifth-stage signal output circuit 705, a sixth-stage signal output circuit 706, and a seventh-stage signal output circuit 707. In other embodiments, the delay signal output circuit includes two or more signal output circuits.

Specifically, the first-stage signal output circuit 701 generates the first-stage delay output signal ActBnk1 according to the initial input signal ActBnk0, the first pulse signal ActClk, and the second pulse signal PreClk. The rising edge of the first-stage delay output signal ActBnk1 has a first delay with respect to the rising edge of the initial input signal ActBnk0, and the first delay is the pulse period t1 of the first pulse signal ActClk. The falling edge of the first-stage delay output signal ActBnk1 has a second delay with respect to the falling edge of the initial input signal ActBnk0, and the second delay is the pulse period t2 of the second pulse signal PreClk.

The second-stage signal output circuit 702 generates a second-stage delay output signal ActBnk2 according to the first-stage delay output signal ActBnk1, the first pulse signal ActClk, and the second pulse signal PreClk. The rising edge of the second-stage delay output signal ActBnk2 has a first delay with respect to the first-stage delay output signal ActBnk1. The falling edge of the second-stage delay output signal ActBnk2 has a second delay with respect to the first-stage delay output signal ActBnk1.

The third-stage signal output circuit 703 generates a third-stage delay output signal ActBnk3 according to the second-stage delay output signal ActBnk2, the first pulse signal ActClk, and the second pulse signal PreClk. The rising edge of the third-stage delay output signal ActBnk3 has a first delay with respect to the second-stage delay output signal ActBnk2. The falling edge of the third-stage delay output signal ActBnk3 has a second delay with respect to the second-stage delay output signal ActBnk2.

The fourth-stage signal output circuit 704 generates a fourth-stage delay output signal ActBnk4 according to the third-stage delay output signal ActBnk3, the first pulse signal ActClk, and the second pulse signal PreClk. The rising edge of the fourth-stage delay output signal ActBnk4 has a first delay with respect to the third-stage delay output signal ActBnk3. The falling edge of the fourth-stage delay output signal ActBnk4 has a second delay with respect to the third-stage delay output signal ActBnk3.

The fifth-stage signal output circuit 705 generates a fifth-stage delay output signal ActBnk5 according to the fourth-stage delay output signal ActBnk4, the first pulse signal ActClk, and the second pulse signal PreClk. The rising edge of the fifth-stage delay output signal ActBnk5 has a first delay with respect to the fourth-stage delay output signal ActBnk4. The falling edge of the fifth-stage delay output signal ActBnk5 has a second delay with respect to the fourth-stage delay output signal ActBnk4.

The sixth-stage signal output circuit 706 generates a sixth-stage delay output signal ActBnk6 according to the fifth-stage delay output signal ActBnk5, the first pulse signal ActClk, and the second pulse signal PreClk. The rising edge of the sixth-stage delay output signal ActBnk6 has a first delay with respect to the fifth-stage delay output signal ActBnk5. The falling edge of the sixth-stage delay output signal ActBnk6 has a second delay with respect to the fifth-stage delay output signal ActBnk5.

The seventh-stage signal output circuit 707 generates the seventh-stage delay output signal ActBnk7 according to the sixth-stage delay output signal ActBnk6, the first pulse signal ActClk, and the second pulse signal PreClk. The rising edge of the seventh-stage delay output signal ActBnk7 has a first delay with respect to the sixth-stage delay output signal ActBnk6. The falling edge of the seventh-stage delay output signal ActBnk7 has a second delay with respect to the sixth-stage delay output signal ActBnk6.

Referring to FIG. 21, more specifically, in this embodiment, the first control module of the signal output circuit is further configured to receive the first control signal ActEn, and the second control module of the signal output circuit is further configured to receive the second control signal PreEn. The first pulse signal ActClk and the second pulse signal PreClk are inverted signals. Each stage signal output circuit is configured to generate a delay output signal of the current stage according to the first control signal ActEn, the second control signal PreEn, the first pulse signal ActClk, the second pulse signal PreClk, and the delay output signal outputted by the signal output circuit of the previous stage, and the stability of the output of the signal output circuit is ensured by receiving the first control signal ActEn and the second control signal PreEn.

Still referring to FIG. 21, in this embodiment, the delay signal output circuit 700 further includes an initial signal output circuit 710 including a first control module, a second control module, and a signal output module. The first control module is configured to receive the first pulse signal ActClk and a first power signal Vdd, and generate a first adjustment signal (not illustrated in figures) according to the first pulse signal ActClk and the first power signal Vdd. The second control module of the initial signal output circuit is configured to receive the second pulse signal PreClk and a second power signal Vss, and generate a second adjustment signal (not illustrated in figures) according to the second pulse signal PreClk and the second power signal Vss. The signal output module is configured to generate the initial input signal according to the first adjustment signal (not illustrated in figures) and the second adjustment signal (not illustrated in figures). The delay output signal of the initial signal output circuit generated according to the first power signal Vdd and the second power signal Vss, i.e., the initial input signal ActBnk0 outputted by the initial output circuit 710 according to the initial signal can avoid the delay caused by a circuit element of the signal output circuit compared with the input signal ActBnk0 directly inputted from the outside. The circuit of the initial signal output circuit 710 herein may be the same as the signal output circuit described above, and the details will not be elaborated herein. However, this embodiment is not limited thereto.

In an example, reference is made to FIG. 22 and FIG. 23, which are presented by taking a delay signal output circuit 700 including four signal output circuits as an example. The first clock end ActClk of the signal output circuit is configured to receive the first pulse signal ActClk. The second clock end PreClk of the signal output circuit is configured to receive the second pulse signal PreClk. The first control end ActEn of the signal output circuit is configured to receive the first control signal ActEn. The second control end PreEn of the signal output circuit is configured to receive the second control signal PreEn. The signal output end ActBnk of the signal output circuit is configured to output the delay output signal of the current stage. The signal output circuit further includes a first signal end ActEnPre and a second signal end PreEnPre (the signal input ends of the signal output circuit). With reference to FIG. 23, the first signal end ActEnPre of the initial signal output circuit is configured to receive the first power signal Vdd, and the second signal end PreEnPre of the initial signal output circuit is configured to receive the second power signal Vss. The first signal ends ActEnPre and the second signal ends PreEnPre of the other signal output circuits are configured to receive the delay output signals outputted by the signal output circuits of the respective previous stages.

Referring to FIG. 21 and FIG. 24, the first-stage signal output circuit 701 generates a first-stage delay output signal ActBnk1 according to the initial input signal ActBnk0. The second-stage signal output circuit 702 generates a second-stage delay output signal ActBnk1 according to the first-stage delay output signal ActBnk1. The third-stage signal output circuit 703 generates a third-stage delay output signal ActBnk3 according to the second-stage delay output signal ActBnk2. The fourth-stage signal output circuit 704 generates a fourth-stage delay output signal ActBnk4 (not illustrated in figures) according to the third-stage delay output signal ActBnk3. The fifth-stage signal output circuit 705 generates a fifth-stage delay output signal ActBnk5 (not illustrated in figures) according to the fourth stage delay output signal ActBnk4. The sixth-stage signal output circuit 706 generates a sixth-stage delay output signal ActBnk6 (not illustrated in figures) according to the fifth-stage delay output signal ActBnk5. The seventh-stage signal output circuit 707 generates a seventh-stage delay output signal ActBnk7 according to the sixth-stage delay output signal ActBnk6 (not illustrated in figures).

Compared with the related art, the first oscillation signal is generated according to the control signal, that is, when the control signal is at the effective level, the first oscillation signal with a certain period is generated. The second oscillation signal is generated based on the first oscillation signal according to the magnification selection signal. That is, the period of the first oscillation signal is changed based on the magnification selection signal, to generate the corresponding second oscillation signal. Then the second oscillation signal is used as a signal source to generate the pulse signal, and the pulse period of the generated pulse signal is the same as the period of the second oscillation signal. In the process of generating the pulse signal, if the magnification selection signal changes, the amplitude of adjusting the period of the first oscillation signal changes, so that the period of the generated second oscillation signal changes, thereby generating the first pulse signal and the second pulse signal with adjustable periods. Moreover, a delay-controllable delay signal is generated according to the first pulse signal and the second pulse signal. Relative to the input signal, the rising edge of the delay signal has a first delay, and the falling edge has a second delay. The first delay is the pulse period of the first pulse signal, and the second delay is the pulse period of the second pulse signal. Therefore, the delay time of the delay signal can be adjusted by adjusting the pulse periods of the first pulse signal and the second pulse signal. Meanwhile, adjusting the delay time of the delay signal does not need to connect more delay cells, thereby simplifying the circuit structure, making an area of circuit layout small and the power consumption of the circuit small.

It is to be understood that each unit involved in this embodiment is a logical unit. In practical applications, a logical unit can be a physical unit, a part of a physical unit, or a combination of multiple physical units. Furthermore, in order to highlight the innovation part of this disclosure, this embodiment does not introduce units that are not closely related to solving the technical problems proposed by this disclosure. However, it does not indicate that no other unit exists in this embodiment.

Those ordinary skilled in the art can understand that the foregoing embodiments are specific embodiments for implementing the disclosure. In practical applications, various modifies can be made in form and details, without departing from the spirit and the scope of the embodiments of this disclosure.

INDUSTRIAL APPLICABILITY

In the embodiments of the disclosure, the stagger signal generation circuit includes: a stagger pulse generation circuit and a delay signal output circuit. The stagger pulse generation circuit is configured to generate a first pulse signal according to a first control signal and generate a second pulse signal according to a second control signal. The first control signal and the second control signal are inverted signals. The first pulse signal and the second pulse signal are stagger pulse signals. The delay signal output circuit includes G signal output circuits, and G is an integer greater than or equal to 2. Each non-first-stage signal output circuits receives a delay output signals outputted by a respective previous-stage signal output circuit as an input signal of a current-stage signal output circuit, and a first-stage signal output circuit receives an initial input signal as an input signal of the first-stage signal output circuit. The embodiments of this disclosure generate a first pulse signal and a second pulse signal with adjustable periods, and generate a delay signal with a controllable delay according to the first pulse signal and the second pulse signal, and an area of a circuit layout is small, and the power consumption of a circuit is low.

The invention claimed is:

1. A stagger signal generation circuit, comprising:
a stagger pulse generation circuit, configured to generate a first pulse signal according to a first control signal and generate a second pulse signal according to a second control signal, the first control signal and the second control signal being inverted signals, and the first pulse signal and the second pulse signal being stagger pulse signals; and
a delay signal output circuit comprising G signal output circuits, G being an integer greater than or equal to 2, each signal output circuit being configured to receive an input signal, the first pulse signal and the second pulse signal and output a delay output signal;
wherein each non-first-stage signal output circuit receives a delay output signal outputted by a respective previous-stage signal output circuit as an input signal of a current-stage signal output circuit, and a first-stage signal output circuit receives an initial input signal as an input signal of the first-stage signal output circuit;
a rising edge of a delay output signal generated by each signal output circuit has a first delay from a rising edge of a received delay output signal outputted by a respective previous-stage signal output circuit or the initial input signal; and a falling edge of a delay output signal generated by each signal output circuit has a second delay from a falling edge of a received delay output signal outputted by a respective previous-stage signal output circuit or the initial input signal.

2. The stagger signal generation circuit of claim 1, wherein the first pulse signal has an equal pulse period as the second pulse signal.

3. The stagger signal generation circuit of claim 1, wherein the stagger pulse generation circuit comprises:
a signal generation circuit, configured to generate the first control signal and the second control signal according to an activation signal;
a first pulse generation circuit, configured to generate the first pulse signal according to the first control signal; and
a second pulse generation circuit, configured to generate the second pulse signal according to the second control signal.

4. The stagger signal generation circuit of claim 3, wherein the signal generation circuit comprises:
a reset circuit, configured to receive a first reset signal and the activation signal, and generate the first control signal based on the first reset signal and the activation signal; and
a reverse circuit, configured to receive the first control signal, and generate the second control signal based on the first control signal.

5. The stagger signal generation circuit of claim 4, wherein the signal generation circuit further comprises: a reset signal generation circuit, configured to generate a second reset signal according to the first reset signal and the first control signal, so that when the first reset signal is in a reset state, the second reset signal is in a reset state, and when the first reset signal is in a non-reset state, the second reset signal generates a reset narrow pulse comprised in the second reset signal based on a changing edge of the first control signal.

6. The stagger signal generation circuit of claim 3, wherein the first pulse generation circuit comprises:
an oscillation circuit, configured to receive the first control signal, and generate a first oscillation signal according to the first control signal;
a period adjustment circuit, configured to receive the first oscillation signal and a magnification selection signal, and output a second oscillation signal, wherein a period of the second oscillation signal is a period of the first oscillation signal or a period of an oscillation adjustment signal, and the second oscillation signal is selected according to the magnification selection signal; and
a pulse conversion circuit, configured to receive the second oscillation signal and output a pulse signal, a pulse of the first pulse signal being generated based on a signal changing edge of the second oscillation signal, and a pulse period of the first pulse signal being same as a period of the second oscillation signal.

7. The stagger signal generation circuit of claim 6, wherein the second pulse generation circuit and the first pulse generation circuit have a same circuit structure.

8. The stagger signal generation circuit of claim 6, wherein the period adjustment circuit comprises:
   a delay circuit, configured to receive the first oscillation signal, and generate the oscillation adjustment signal based on the first oscillation signal, a period of the oscillation adjustment signal being different from a period of the first oscillation signal; and
   a selection circuit, configured to receive the magnification selection signal, and select the first oscillation signal or the oscillation adjustment signal as the second oscillation signal based on the magnification selection signal.

9. The stagger signal generation circuit of claim 8, wherein the delay circuit comprises E delay sub-circuits connected in series, the oscillation adjustment signal comprises E delay signals, and E is a positive integer;
   a first-stage delay sub-circuit is configured to generate a first delay signal according to the first oscillation signal, and input the first delay signal into a second-stage delay sub-circuit; and
   an $F^{th}$-stage delay sub-circuit is configured to generate an $F^{th}$ delay signal according to an $(F-1)^{th}$ delay signal, F is a positive integer less than or equal to E and greater than or equal to 2.

10. The stagger signal generation circuit of claim 9, wherein the selection circuit comprises: a magnification selector, comprising a first selection input end, a second selection input end, a selection signal end, and a selection output end, wherein the first selection input end and the second selection input end are configured to receive one signal of the oscillation adjustment signal or the first oscillation signal respectively, the selection signal end is configured to receive the magnification selection signal, and the selection output end is configured to output the second oscillation signal.

11. The stagger signal generation circuit of claim 6, wherein the oscillation circuit comprises:
   an oscillation circuit and a trigger circuit connected with the oscillation circuit;
   the trigger circuit is configured to receive a reset signal and the first control signal, and trigger the oscillation circuit based on the reset signal and the first control signal; and
   in responsive to be triggered, the oscillation circuit is configured to generate the first oscillation signal according to the first control signal.

12. The stagger signal generation circuit of claim 11, wherein the oscillation circuit comprises: a ring oscillator formed by connecting A inverters in series, and A is a positive odd number.

13. The stagger signal generation circuit of claim 12, wherein the oscillation circuit further comprises:
   a first inverter set, comprising B inverters connected in series, B being a positive even number; and
   a first selection circuit, configured to receive a first selection signal, and connect the first inverter set in series between adjacent inverters in the ring oscillator based on the first selection signal.

14. The stagger signal generation circuit of claim 6, wherein the pulse conversion circuit comprises: a pulse converter, configured to receive the second oscillation signal and generate the first pulse signal based on the second oscillation signal.

15. The stagger signal generation circuit of claim 1, wherein the signal output circuit comprises:
   a first control circuit, configured to receive the first pulse signal and the input signal and output a first adjustment signal, a first preset edge of the first adjustment signal having a first delay with respect to a rising edge of the input signal, and the first delay being a pulse period of the first pulse signal;
   a second control circuit, configured to receive the second pulse signal and the input signal and output a second adjustment signal, a second preset edge of the second adjustment signal having a second delay with respect to a falling edge of the input signal, and the second delay being a pulse period of the second pulse signal; and
   a signal output circuit, configured to receive the first adjustment signal and the second adjustment signal and output a delay output signal, a rising edge of the delay output signal being generated based on the first preset edge of the first adjustment signal, and a falling edge of the delay output signal being generated based on the second preset edge of the second adjustment signal.

16. The stagger signal generation circuit of claim 15, wherein the signal output circuit comprises:
   a first receiving circuit, configured to receive the first pulse signal and the first adjustment signal, and generate a first pulse control signal during a period that the first adjustment signal is at an effective level, the first pulse control signal and the first pulse signal have a same pulse phase;
   a second receiving circuit, configured to receive the second pulse signal and the second adjustment signal, and generate a second pulse control signal during a period that the second adjustment signal is at an effective level, the second pulse control signal and the second pulse signal have a same pulse phase; and
   a latch circuit, configured to receive the first pulse control signal and the second pulse control signal, and generate the delay output signal.

17. The stagger signal generation circuit of claim 16, wherein the first receiving circuit is further configured to receive the first control signal, and generate the first pulse control signal according to the first pulse signal during a period that the first adjustment signal and the first control signal are at an effective level.

18. The stagger signal generation circuit of claim 16, wherein the second receiving circuit is further configured to receive the second control signal, and generate the second pulse control signal according to the second pulse signal during a period that the second adjustment signal and the second control signal are at an effective level.

19. The stagger signal generation circuit of claim 1, wherein the delay signal output circuit further comprises:
   an initial signal output circuit, comprising a first control circuit, a second control circuit, and a signal output circuit;
   the first control circuit is configured to receive the first pulse signal and a first power signal, and generate a first adjustment signal according to the first pulse signal and the first power signal;
   the second control circuit is configured to receive the second pulse signal and a second power signal, and generate a second adjustment signal according to the second pulse signal and the second power signal; and
   the signal output circuit is configured to generate the initial input signal according to the first adjustment signal and the second adjustment signal.

* * * * *